US012648331B2

(12) United States Patent
Jeon et al.

(10) Patent No.: US 12,648,331 B2
(45) Date of Patent: Jun. 2, 2026

(54) DISPLAY DEVICE

(71) Applicant: SAMSUNG DISPLAY CO., LTD.,
Yongin-si (KR)

(72) Inventors: Mu Kyung Jeon, Ulsan (KR); Suk Kim, Hwaseong-si (KR); Sung Chan Jo, Seoul (KR)

(73) Assignee: SAMSUNG DISPLAY CO., LTD.,
Yongin-si (KR)

( * ) Notice: Subject to any disclaimer, the term of this patent is extended or adjusted under 35 U.S.C. 154(b) by 769 days.

(21) Appl. No.: 17/931,598

(22) Filed: Sep. 13, 2022

(65) Prior Publication Data

US 2023/0109051 A1    Apr. 6, 2023

(30) Foreign Application Priority Data

Oct. 1, 2021    (KR) ........................ 10-2021-0130784

(51) Int. Cl.
*H10K 59/65*        (2023.01)
*G06V 40/13*        (2022.01)
(Continued)

(52) U.S. Cl.
CPC ......... *H10K 59/65* (2023.02); *G06V 40/1318* (2022.01); *G06V 40/1359* (2022.01);
(Continued)

(58) Field of Classification Search
CPC ...... H10K 59/65; H10K 59/12; H10K 59/122; H10K 65/00; H10K 30/00; H10K 50/00;
(Continued)

(56) References Cited

U.S. PATENT DOCUMENTS

2004/0184027 A1*  9/2004  Mizutani ............. G09G 3/3648
                                                        356/71
2012/0187394 A1*  7/2012  Hatano ................ H01G 9/2068
                                                        257/E31.127

(Continued)

FOREIGN PATENT DOCUMENTS

KR    10-2013-0068865 A    6/2013
KR        20130068865 A  *  6/2013  ........... H10H 20/833
(Continued)

OTHER PUBLICATIONS

Office Action dated Feb. 12, 2025 in corresponding KR Patent Appln. No. 10-2021-0130784, in Korean, 6 pages.

*Primary Examiner* — S M Sohel Imtiaz
(74) *Attorney, Agent, or Firm* — F. CHAU & ASSOCIATES, LLC

(57)        ABSTRACT

A display device includes a substrate including a display area and a photo sensing area overlapping the display area, a plurality of pixels disposed at the display area and having an emission area, and a plurality of photo sensors disposed at the photo sensing area and having an effective sensing area. Each of the plurality of pixels includes a light-emitting element including a display pixel electrode, an emissive layer, and a common electrode. Each of the plurality of photo sensors includes a photo sensing element including a sensing electrode, a photoelectric conversion layer and the common electrode. The common electrode is disposed between the emissive layer and the photoelectric conversion layer. A center point of the effective sensing area is located in the emission area in a plan view.

8 Claims, 20 Drawing Sheets

(51) Int. Cl.

| | |
|---|---|
| G06V 40/12 | (2022.01) |
| G09G 3/3233 | (2016.01) |
| H10K 59/12 | (2023.01) |

(52) U.S. Cl.
CPC ... G09G 3/3233 (2013.01); G09G 2300/0426 (2013.01); G09G 2300/0819 (2013.01); G09G 2300/0842 (2013.01); G09G 2360/14 (2013.01); H10K 59/12 (2023.02)

(58) Field of Classification Search
CPC .. H10K 59/123; H10K 59/60; G06V 40/1318; G06V 40/1359; G09G 3/3233
See application file for complete search history.

(56) References Cited

U.S. PATENT DOCUMENTS

| | | | |
|---|---|---|---|
| 2019/0095674 A1* | 3/2019 | Ko | ..................... G06V 40/1318 |
| 2020/0127064 A1* | 4/2020 | Ikeda | ..................... H10K 59/60 |
| 2020/0127074 A1* | 4/2020 | Sato | ..................... H10D 86/441 |

FOREIGN PATENT DOCUMENTS

| | | |
|---|---|---|
| KR | 10-2017-0123578 | 11/2017 |
| KR | 10-2018-0067196 | 6/2018 |
| KR | 10-2020-0037653 | 4/2020 |
| KR | 10-2020-0049959 | 5/2020 |
| WO | 2020165656 | 8/2020 |
| WO | 2020165686 | 8/2020 |

* cited by examiner

DR1

DR2

DA: EA, NEA
PSA: RA, NEA

EL: 210, 220, 230
PD: 230, 240, 250

EL: 210, 220, 230
PD: 230, 240, 250

EL: 210, 220, 230
PD: 230, 240, 250

EL: 210, 220, 230
PD: 230, 240, 250

DA: EA, NEA
PSA: RA, NEA (a)                    (b)                    (c)

EL: 210, 220, 230
PD: 230, 240, 250

EL: 210, 220, 230
PD: 230, 240, 250

DA: EA, NEA
PSA: RA, NEA

DISPLAY DEVICE

This application claims priority from Korean Patent Application No. 10-2021-0130784 filed on Oct. 1, 2021, in the Korean Intellectual Property Office, the disclosure of which is incorporated herein by reference in its entirety.

BACKGROUND

1. Technical Field

The present invention relates to a display device, more particularly to a display device a pixel and a photo sensor sharing a common electrode.

2. Description of the Related Art

Display devices become more and more important as multimedia technology evolves. Accordingly, a variety of types of display devices such as liquid-crystal display (LCD) devices and organic light-emitting display (OLED) devices are currently being used.

An organic light-emitting display device displays images by using organic light-emitting diodes (OLEDs) that utilize the phenomenon that holes and electrons recombine to generate light. Such an organic light-emitting display device has advantages in that it has fast response speed, high luminance and large viewing angle, and low power consumption.

Recently, research and development on the technology for integrating sensors for recognizing touch or fingerprint into such display panels is conducted.

SUMMARY

Aspects of the present invention provide a display device including a display panel in which sensors for detecting touch or recognizing a fingerprint are incorporated so that the fabrication cost can be saved and the limit resolution of the display panel can be avoided from decreasing.

This and other aspects, embodiments and advantages of the present invention will become immediately apparent to those of ordinary skill in the art upon review of the Detailed Description and Claims to follow.

According to an embodiment of the present invention, a display device comprises a substrate comprising a display area and a photo sensing area overlapping the display area, a plurality of pixels disposed at the display area and having an emission area, and a plurality of photo sensors disposed at the photo sensing area and having an effective sensing area. Each of the plurality of pixels comprises a light-emitting element comprising a display pixel electrode, an emissive layer, and a common electrode. Each of the plurality of photo sensors comprises a photo sensing element comprising a sensing electrode, a photoelectric conversion layer and the common electrode. The common electrode is disposed between the emissive layer and the photoelectric conversion layer. A center point of the effective sensing area is located in the emission area in a plan view.

The emission area may overlap the effective sensing area.

The effective sensing area may be larger than the emission area in the plan view, and an edge of the effective sensing area surrounds an edge of the emission area in the plan view.

The emissive layer may be disposed between the photoelectric conversion layer and the substrate.

The display device may further comprise a transistor layer disposed between the substrate and the photoelectric conversion layer. The sensing electrode is connected to the transistor layer through a contact hole penetrating the common electrode.

The photoelectric conversion layer may be disposed between the emissive layer and the substrate.

The display device may further comprise a transistor layer disposed between the substrate and the emissive layer. The display pixel electrode is connected to the transistor layer through a contact hole penetrating the common electrode.

The effective sensing area may surround the emission area in the plan view.

The effective sensing area may not overlap the emission area.

The emissive layer may be disposed between the photoelectric conversion layer and the substrate.

According to an embodiment of the present invention, a display device comprises a substrate, a transistor layer disposed on the substrate and comprising a first thin-film transistor and a second thin-film transistor, a display pixel electrode disposed on the transistor layer and connected to the first thin-film transistor, an emissive layer disposed on the display pixel electrode, a common electrode disposed on the emissive layer, a photoelectric conversion layer disposed on the common electrode, and a sensing electrode disposed on the photoelectric conversion layer and connected to the second thin-film transistor. The display pixel electrode, the emissive layer and the common electrode form a light-emitting diode. The common electrode, the photoelectric conversion layer and the sensing electrode form a light-receiving diode. The light-emitting diode and the light-receiving diode share the common electrode The emissive layer and the photoelectric conversion layer may overlap each other.

The photoelectric conversion layer may be larger than the emissive layer in a plan view, and an edge of the photoelectric conversion layer surrounds an edge of the emissive layer in the plan view.

The photoelectric conversion layer may surround the emission area in a plan view.

The photoelectric conversion layer may not overlap the emissive layer.

The sensing electrode may be connected to the second thin-film transistor through a contact hole penetrating through the common electrode.

According to an embodiment of the present invention, a display device comprises a substrate, a transistor layer disposed on the substrate and comprising a first thin-film transistor and a second thin-film transistor, a sensing electrode disposed on the transistor layer and connected to the second thin-film transistor, a photoelectric conversion layer disposed on the sensing electrode, a common electrode disposed on the photoelectric conversion layer, an emissive layer disposed on the common electrode, and a display pixel electrode disposed on the emissive layer and connected to the first thin-film transistor. The sensing electrode, the photoelectric conversion layer and the common electrode form a light-receiving diode, and the common electrode, the emissive layer and the display pixel electrode form a light-emitting diode. The light-receiving diode and the light-emitting diode share the common electrode.

The emissive layer and the photoelectric conversion layer may overlap each other.

The photoelectric conversion layer may be larger than the emissive layer in a plan view, and an edge of the photoelectric conversion layer surrounds an edge of the emissive layer in the plan view.

The display pixel electrode may be connected to the first thin-film transistor through a contact hole penetrating through the common electrode.

According to the embodiments of the present invention, the fabrication cost can be saved and the limit resolution of the display panel can be avoided from decreasing by incorporating sensors for detecting touch or recognizing a fingerprint into a display panel of a display device.

It should be noted that effects of the present invention are not limited to those described above and other effects of the present invention will be apparent to those skilled in the art from the following descriptions.

BRIEF DESCRIPTION OF THE DRAWINGS

The above and other aspects and features of the present invention will become more apparent by describing in detail embodiments thereof with reference to the attached drawings, in which.

DETAILED DESCRIPTION OF THE EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this invention will be thorough and complete, and will fully convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present invention. Similarly, the second element could also be termed the first element.

Hereinafter, embodiments of the present invention will be described with reference to the accompanying drawings.

Figure 1:
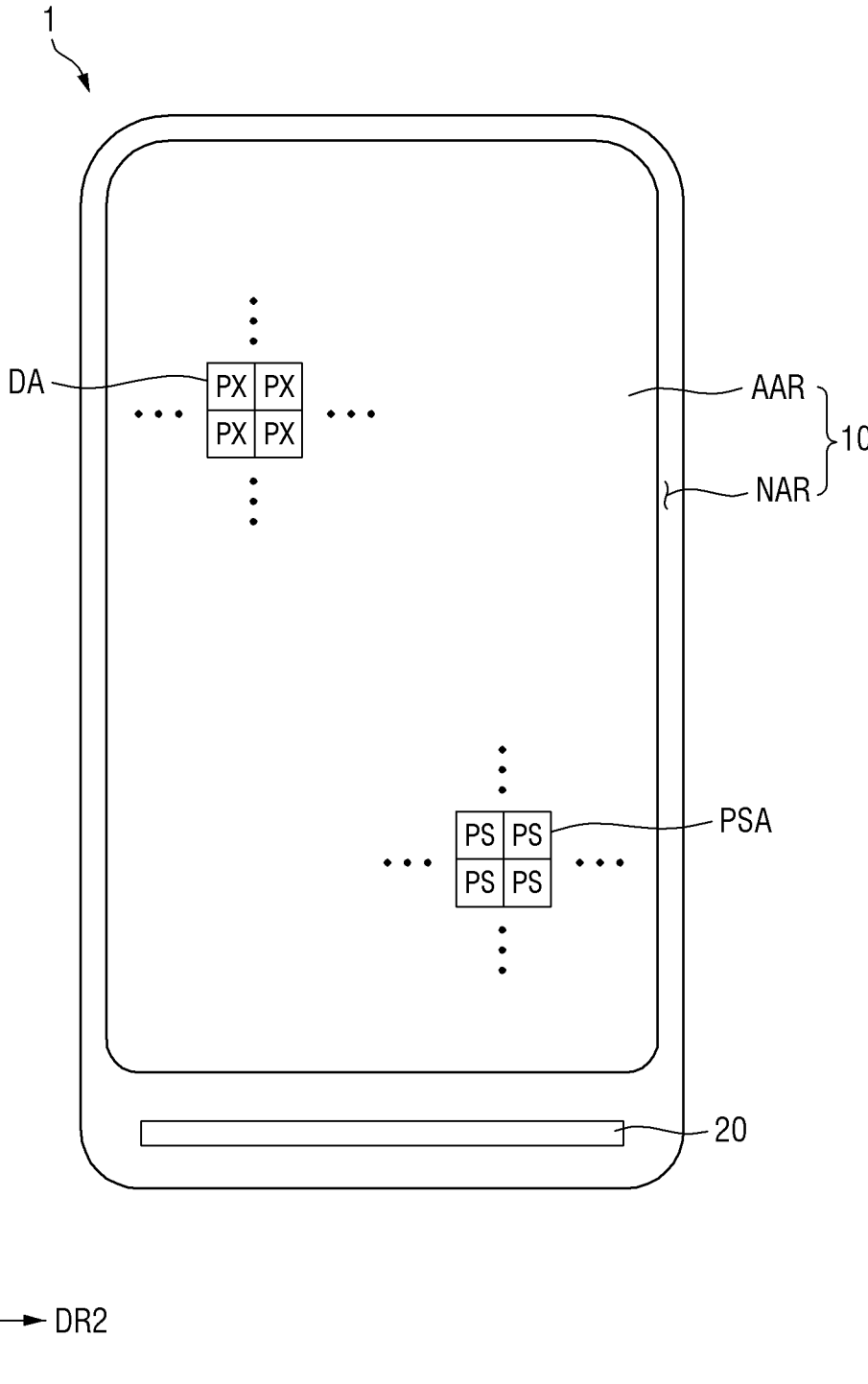
FIG. 1 is a plan view schematically showing a display device according to an embodiment of the present invention.

FIG. 1 is a plan view schematically showing a display device according to an embodiment of the present invention.

Referring to FIG. 1, a display device 1 may include a display panel 10 and a driver 20.

The display panel 10 may include an active area AAR and a non-active area NAR.

The active area AAR includes a display area DA where images are displayed. The active area AAR may completely overlap the display area DA. A plurality of pixels PX may be arranged in the display area DA to display images. Each of the pixels PX may include a light-emitting element EL.

The active area AAR further includes a photo sensing area PSA. The photo sensing area PSA is a photosensitive area and senses the amount (i.e., the intensity) of incident light or the wavelength of the incident light. The photo sensing area PSA may overlap the display area DA. According to an embodiment of the present invention, the photo sensing area PSA may be identical to the display area DA when viewed from the top and may completely overlap the display area DA. According to an embodiment, the photo sensing area PSA may be disposed only in a part of the active area AAR. For example, the photo sensing area PSA may be disposed only in a limited area necessary for fingerprint recognition. In some embodiments, the photo sensing area PSA may overlap a part of the display area DA but may not overlap another part of the display area DA.

The photo sensing area PSA may include a plurality of photo sensors PS that receive light. Each of the photo sensors PS may include a photo sensing element PD.

The non-active area NAR may surround the active area AAR. The driver 20 may be disposed in the non-active area NAR. The driver 20 may drive the plurality of pixels PX and/or the plurality of photo sensors PS. The driver 20 may output signals and voltages for driving the display panel 10. The driver 20 may be implemented as an integrated circuit (IC) and may be mounted on the display panel 10. Signal lines for transferring signals between the driver 20 and the active area AAR may be further disposed in the non-active area NAR.

Figure 2:
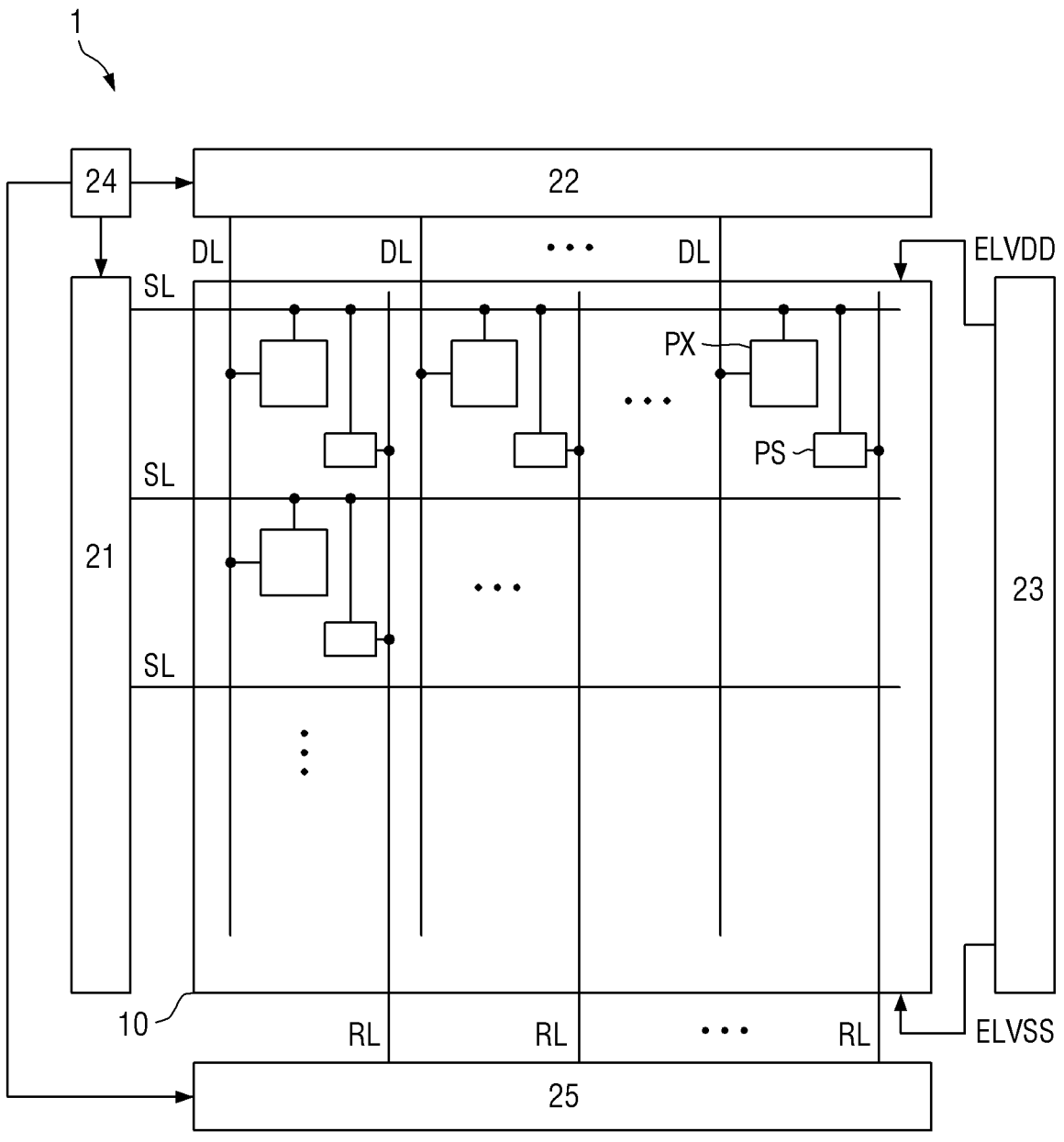
FIG. 2 is a block diagram of a display device according to an embodiment of the present invention.

FIG. 2 is a block diagram of a display device according to an embodiment of the present invention.

Referring to FIG. 2, the plurality of pixels PX and the plurality of photo sensors PS disposed in the active area AAR of the display panel 10 may be driven by the driver 20.

Each of the plurality of pixels PX may include a light-emitting element EL (see FIG. 3) and a driver circuit DC (see FIG. 3) for controlling the amount of light emitted from the light-emitting element EL. The driver 20 may apply a driving signal or a driving voltage to one or more transistors and various signal lines included in the driver circuit DC associated with each of the plurality of pixels PX.

The photo sensor PS may include a photo sensing element PD (see FIG. 3) and a driver circuit DC for controlling the amount of light received by the photo sensing element PD. The driver 20 may apply a driving signal or a driving voltage to one or more transistors and various signal lines included in the driver circuit DC associated with each of the plurality of photo sensors PS, and may receive the sensing sing from the photo sensor PS.

The driver 20 may include a scan driver 21 connected to the scan lines SL, a data driver 22 connected to the data lines DL, a power supply unit 23 for supplying a first supply voltage ELVDD and a second supply voltage ELVSS, and a timing controller 24 for controlling driving timings of the scan driver 21 and the data driver 22. The driver 20 may be connected to the pixels PX to adjust the amount of light emitted from an emissive layer, and may drive the pixels PX to display images. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact. As used herein, components described as being "electrically connected" are configured such that an electrical signal can be transferred from one component to the other (although such electrical signal may be attenuated in strength as it transferred and may be selectively transferred).

The driver 20 may further include a sensing unit 25 connected to the sensing lines RL. The sensing unit 25 may be connected to the photo sensors PS through the sensing lines RL, and may receive an electric current flowing through the photo sensors PS to sense an external input.

The scan driver 21 may sequentially supply scan signals to the pixels PX connected to the scan lines in response to a scan driving start signal from the timing controller 24. In some embodiments, a switching transistor T2 (see FIG. 3) of each of the pixels PX may be turned on in response to the scan signal. The scan driver 21 may also detect a sensing signal for an electric current flowing through the sensing lines RL in response to a sensing driving start signal from the timing controller 24. For example, the third transistor T3 (see FIG. 3) of each of the photo sensors PS may be turned on in response to the scan signals. The data driver 22 may supply data signals of the pixels PX to the data lines in response to a data driving start signal from the timing controller 24.

The power supply unit 23 may apply a supply voltage to the pixels PX and/or the photo sensors PS. The supply voltage may be at least one of a driving voltage, an initialization voltage, a reference voltage and a low-level voltage.

The sensing unit 25 may include the sensing lines RL, and may sense a sensing signal associated with a current flowing through the sensing lines RL.

According to the embodiment of the present invention, the scan lines SL may be connected to a plurality of pixels PX as well as a plurality of photo sensors PS. In some embodiments, the plurality of pixels PX and the plurality of photo sensors PS may be turned on/off in response to the same scan signal. Accordingly, the pattern of a fingerprint 30 may be optically sensed while images are displayed. It should be understood, however, that this is merely illustrative. The types and layout of the signal lines including the scan lines, the data lines and the sensing lines may vary depending on the way how the pixels PX and the photo sensors PS are driven.

Figure 3:
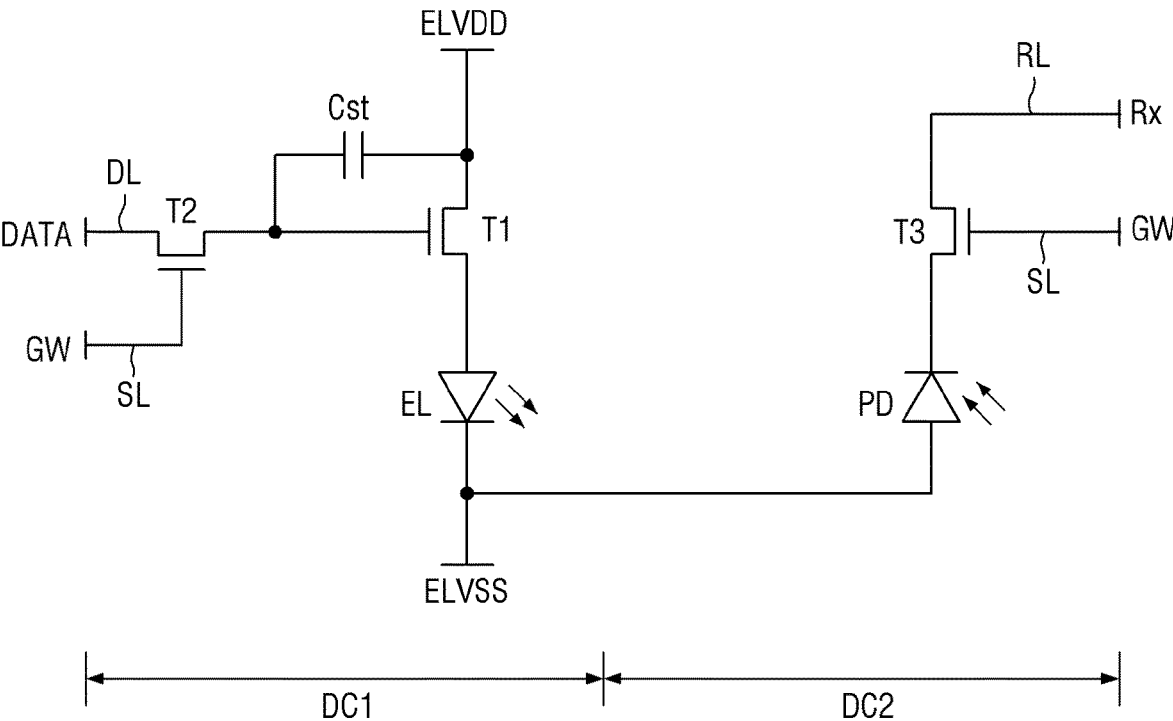
FIG. 3 is a circuit diagram of a pixel and a unit photo sensor of a display device according to an embodiment of the present invention.

FIG. 3 is a circuit diagram of a pixel and a unit photo sensor of a display device according to an embodiment of the present invention.

Referring to FIG. 3, the driver circuit DC may include a display circuit DC1 driving each pixel PX and a sensing circuit DC2 driving the photo sensor PS. According to the embodiment of the present invention, the display circuit DC1 and the sensing circuit DC2 may be electrically connected with each other, and may apply the same potential to one driver circuit DC to drive the pixels PX and the photo sensors PS. In an embodiment, the display circuit DC1 and the sensing circuit DC2 of the driver circuit DC may not be electrically connected with each other.

The driver circuit DC may include a plurality of transistors and various signal lines associated with the pixels PX and the photo sensors PS. The driver circuit DC may be formed on a transistor layer 100 (see FIG. 5) and may be electrically connected to the light-emitting element EL and the photo sensing element PD included in an element layer 200 (see FIG. 5).

The display circuit DC1 may include a light-emitting element EL, a capacitor Cst, a first transistor T1 and a second transistor T2. The display circuit DC1 may control the amount of light emitted from the light-emitting element EL.

The display circuit DC1 may receive a data signal DATA, a first scan signal GW, the first supply voltage ELVDD and the second supply voltage ELVSS. The data signal DATA may be provided through the data line DL, and the first scan signal GW may be provided through the first scan line SL.

The light-emitting element EL may include an anode electrode, a cathode electrode, and an emissive layer 220 (see FIG. 6) interposed therebetween. The light-emitting element EL may be an organic light-emitting diode containing an organic compound. The anode electrode of the light-emitting element EL is connected to the first transistor T1. The cathode electrode of the light-emitting element EL may be connected to a second supply voltage ELVSS terminal to receive the second supply voltage ELVSS. The second supply voltage ELVSS may have a voltage level lower than that of the first supply voltage ELVDD. In the circuit diagram of FIG. 3, the anode electrode of the light-emitting element LE is a display pixel electrode 210 (see FIG. 6) and the cathode electrode of the light-emitting element LE is a common electrode 230 (see FIG. 6).

The capacitor Cst is connected between the gate electrode of the first transistor T1 and the first supply voltage ELVDD terminal. The capacitor Cst includes a capacitor first electrode connected to the gate electrode of the first transistor T1 and a capacitor second electrode connected to the first supply voltage ELVDD terminal.

The first transistor T1 may be a driving transistor, and the second transistor T2 may be a switching transistor. Each of the transistors may include a gate electrode, a source electrode and a drain electrode. One of the source electrode and the drain electrode may be a first electrode and the other may be a second electrode. In the following description, an example where the drain electrode is the first electrode and the source electrode is the second electrode for convenience of illustration.

The first transistor T1 is a driving transistor and may generate a driving current. The gate electrode of the first transistor T1 is connected to the capacitor first electrode, one electrode (e.g., a first source/drain electrode) of the first transistor T1 is connected to the first supply voltage ELVDD terminal, and the other electrode (e.g., a second source/drain electrode) of the first transistor T1 is connected to the anode electrode of the light-emitting element EL. The capacitor second electrode is connected to the one electrode of the first transistor T1. In the cross-sectional view, the first transistor T1 may be the first thin-film transistor TFT1 (see FIG. 5) disposed on the transistor layer 100 and connected to the display pixel electrode 210.

The second transistor T2 is a switching transistor, and has a gate electrode connected to the first scan signal GW terminal, one electrode (e.g., a first source/drain electrode) connected to a data signal DATA terminal, and the other electrode (e.g., a second source/drain electrode) connected to the one electrode of the first transistor T1. The second transistor T2 is turned on in response to the first scan signal GW to perform a switching operation of transferring the data signal DATA to the one electrode of the first transistor T1. The second transistor T2 may be the first thin-film transistor TFT1 disposed on the transistor layer 100 and connected to the display pixel electrode 210.

The capacitor Cst may be charged with a voltage corresponding to the data signal DATA received from the second transistor T2. The first transistor T1 may control the driving current flowing in the light-emitting element EL in proportion to the amount of charges stored in the capacitor Cst.

It should be noted that this is merely illustrative. The display driver circuit DC1 may further include a compensation circuit for compensating threshold voltage deviations ΔVth of the first transistor T1.

The sensing circuit DC2 may include a third transistor T3 and a photo sensing element PD. The sensing circuit DC2 may sense the amount of light incident on the light sensing element PD.

The photo sensing element PD may include an anode electrode, a cathode electrode, and a photoelectric conversion layer 240 (see FIG. 6) interposed therebetween. The anode electrode of the light sensing element PD is connected to the second supply voltage ELVSS terminal and the cathode electrode of the light-emitting element EL. The cathode electrode of the light sensing element PD is connected to the third transistor T3. In the circuit diagram of FIG. 3, the anode electrode of the photo sensing element PD is the common electrode 230 (see FIG. 6) and the cathode electrode is the sensing electrode 250 (see FIG. 6).

The photo sensing element PD may be a photoelectric conversion element that converts externally incident light into an electrical signal. The photo sensing element PD may be, for example, a PN or PIN light-receiving diode, or a phototransistor. A photodiode may be an organic light-receiving diode using an organic material, but the present invention is not limited thereto. It may be an inorganic light-receiving diode made of an inorganic material.

The third transistor T3 may have a gate electrode connected to the first scan signal GW terminal, a first electrode connected to the cathode electrode of the photo sensing element PD, and a second electrode connected to a sensing signal Rx terminal. The third transistor T3 may be turned on in response to the first scan signal GW to transmit a current flowing through the photo sensing element PD to the sensing signal Rx terminal. In the cross-sectional view, the third transistor T3 may be the second thin-film transistor TFT2 (see FIG. 6) disposed on the transistor layer 100 and connected to the sensing electrode 250.

The third transistor T3 may be driven with the same scan signal as the second transistor T2 of the display circuit DC1, but the present invention is not limited thereto. It should be noted that it may be driven by a previous scan signal or a subsequent scan signal.

Although the transistors are N-type metal oxide semiconductor (NMOS) transistors in the drawings, some or all of the transistors may be implemented as P-type metal oxide semiconductor (PMOS) transistors.

Figure 4:
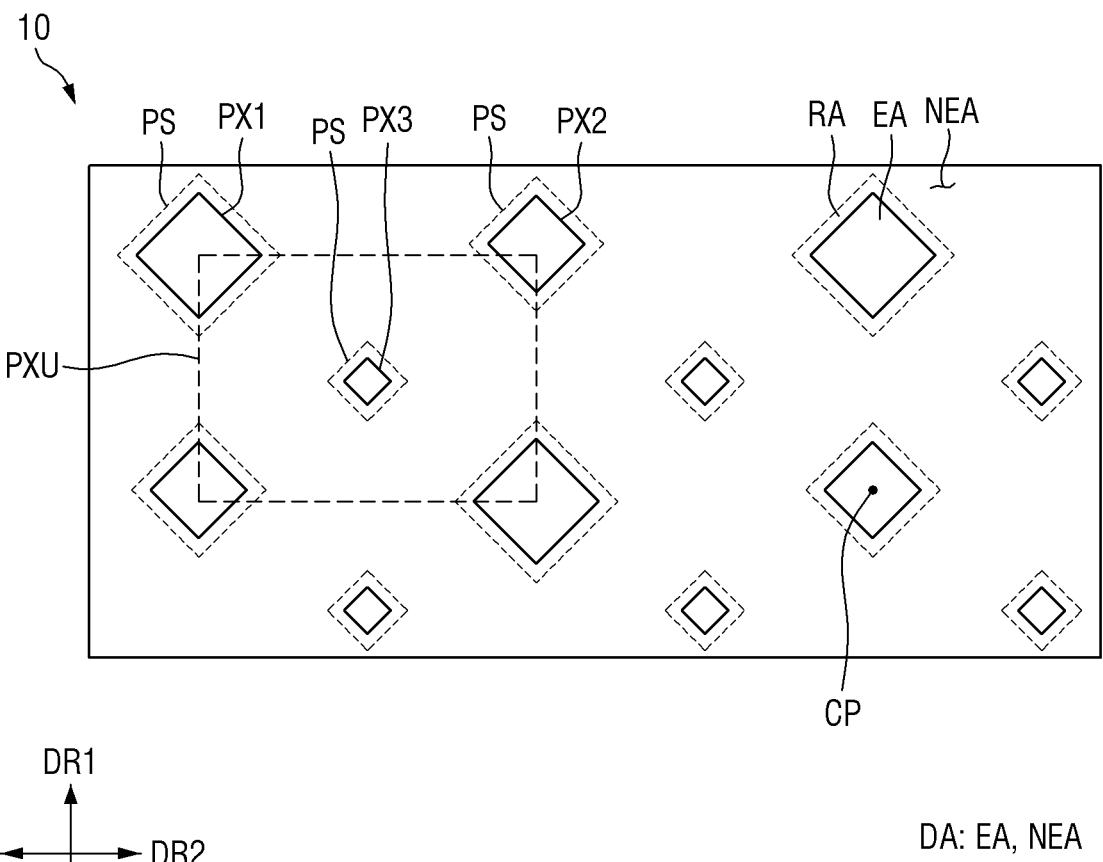
FIG. 4 is a plan view showing a layout of pixels and photo sensors of a display panel according to an embodiment of the present invention.

FIG. 4 is a plan view showing a layout of pixels and photo sensors of a display panel according to an embodiment of the present invention.

Referring to FIG. 4, the display area DA of the pixel PX may include an emission area EA. The emission area EA may be defined as an area where a display pixel electrode 210 (see FIG. 6) exposed by an opening of a first bank layer 260 (see FIG. 6), and the exposed display pixel electrode 210 and the emissive layer 220 (see FIG. 6) overlap each other. The area surrounding the emission area EA may be referred to as a peripheral area NEA. The photo sensor PS may be disposed in the photo sensing area PSA overlapping the display area DA of the pixel PX. The photo sensing area PSA may include an effective sensing area RA. The effective sensing area RA may be defined as an area where the photoelectric conversion layer 240 (see FIG. 6) overlaps the common electrode 230 (see FIG. 6) exposed by the opening of a second bank layer 270 (see FIG. 6). The peripheral area NEA surrounding the effective sensing area RA may be referred to as a non-sensing area. As used herein, the peripheral area NEA refers to an area where the non-emission area and the non-sensing area overlap each other.

Hereinafter, the arrangement relationship between the plurality of pixels PX and the photo sensors PS will be described.

The plurality of pixels PX; PX1, PX2 and PX3 disposed on the display panel 10 may include first color pixels PX1, second color pixels PX2 and third color pixels PX3. According to an embodiment of the present invention, the first color pixels PX1 may be blue pixels, the second color pixels PX2 may be red pixels, and the third color pixels PX3 may be green pixels. The pixels PX may be arranged sequentially and repeatedly to form a matrix.

According to an embodiment of the present invention, the first color pixels PX1 and the second color pixels PX2 may be alternately arranged in the second direction DR2 to form a first row, while third color pixels PX3 may be arranged in the second direction DR2 to form a second row next to the first row. The pixels belonging to the second row may be arranged in a staggered manner in the second direction DR2 with respect to the pixels belonging to the first row. The number of the third color pixels PX3 belonging to the second row may be twice the number of the first color pixels PX1 or the number of the second color pixels PX2 belonging to the first row. The first row and the second row may be repeatedly arranged up to the nth row.

The first color pixels PX1 and the second color pixels PX2 may be alternately arranged in the first direction DR1 to form a first column, while the third color pixels PX3 may be arranged in the first direction DR1 to form a second column next to the first column such that they are spaced apart from one another. In a third column next to the second column, the second color pixels PX2 and the first color pixels PX1 may be alternately arranged, while the third color pixels PX3 may be arranged in the first direction DR1 in a fourth column next to the third column such that they are spaced apart from one another. The arrangement of the pixels may be repeated up to the nth column. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact. As used herein, components described as being "electrically connected" are configured such that an electrical signal can be transferred from one component to the other (although such electrical signal may be attenuated in strength as it transferred and may be selectively transferred).

In the pixel arrangement structure, the first color pixels PX1 and the second color pixels PX2 disposed at the vertices facing each other, respectively, with respect to the center point of the third color pixels PX3, may be defined as one unit pixel PXU.

The color pixels may have different sizes. For example, the third color pixels PX3 may be smaller than the first color pixels PX1 and the second color pixels PX2, and the first color pixels PX1 may be larger than the second color pixels PX2. Although the shape of each color pixel is shown as a diamond, the present invention is not limited thereto. In some embodiments, the shape of each color pixel may be of an octagon, a circle, or other polygons.

Each of the photo sensors PS may be disposed together with the respective pixels PX in the photo sensing area PSA. For example, the photo sensor PS may be disposed to overlap the pixel PX in the vertical direction. The effective sensing area RA of the photo sensor PS may be larger than the emission area EA of the pixel PX.

In some embodiments, the first color pixel PX1 and the photo sensor PS may be disposed to overlap each other in the vertical direction. When the first color pixel PX1 is a blue pixel, the first color pixel PX1 may emit light of a blue wavelength. When the photo sensor PS is disposed to overlap the first color pixel PX1, the light of the blue wavelength may be sensed and converted into an electrical signal.

The second color pixel PX2 and the photo sensor PS may be disposed to overlap each other in the vertical direction. When the second color pixel PX2 is a red pixel, the second color pixel PX2 may emit light of a red wavelength. When the photo sensor PS is disposed to overlap the second color pixel PX2, the light of the red wavelength may be sensed and converted into an electrical signal.

The third color pixel PX3 and the photo sensor PS may be disposed to overlap each other in the vertical direction. When the third color pixel PX3 is a green pixel, the third color pixel PX3 may emit light of a green wavelength. When the photo sensor PS is disposed to overlap the third color pixel PX3, the light of the green wavelength may be sensed and converted into an electrical signal.

In the photo sensor PS disposed in the effective sensing area RA, the intersection of two straight lines connecting vertices facing each other is defined as a virtual center point CP. Since the photo sensor PS overlaps the respective pixel in the vertical direction, the virtual center point CP of the photo sensor PS may be located in the emission area EA.

Figure 5:
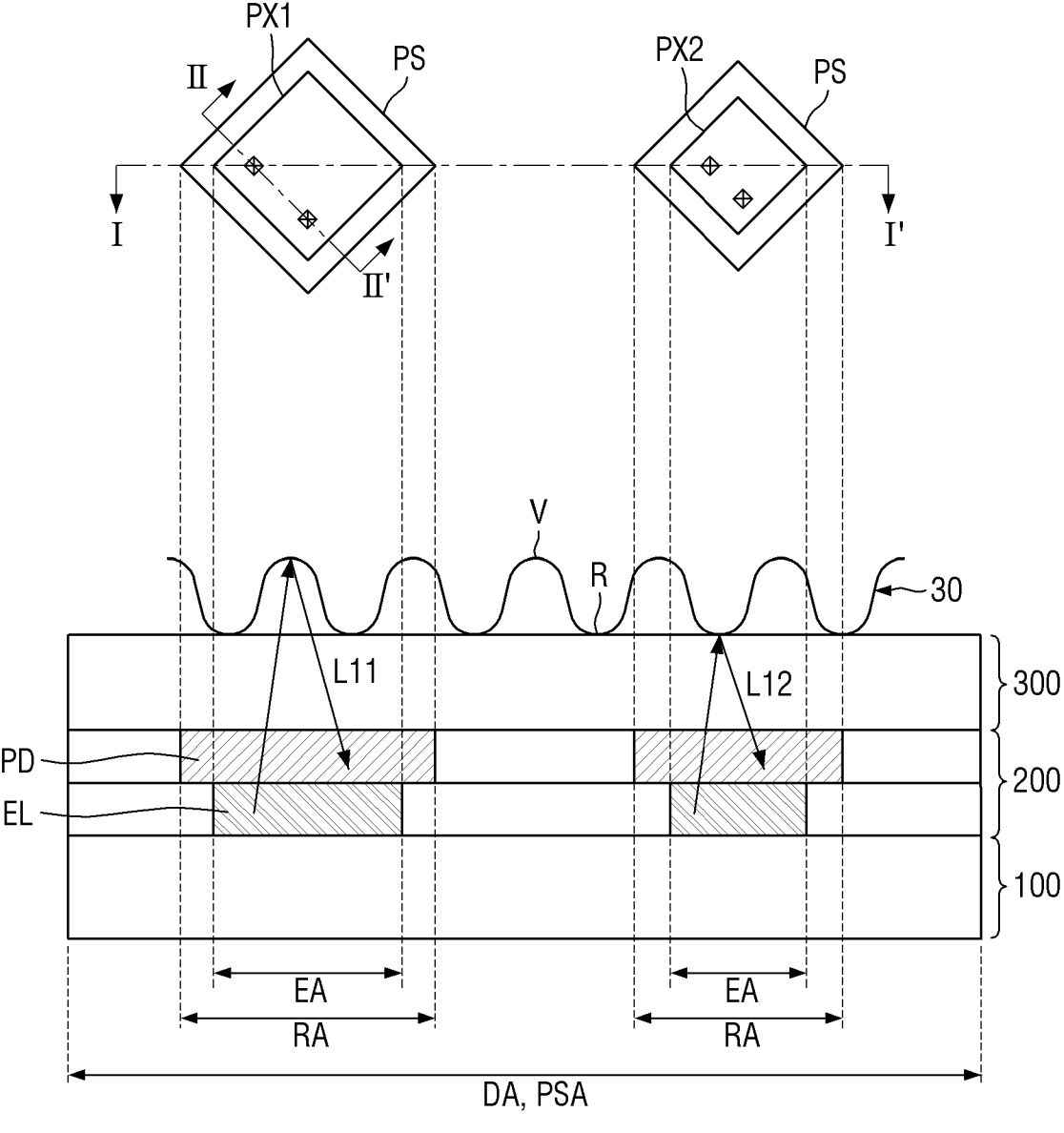
FIG. 5 is a view schematically showing a part of the plan view of FIG. 4 showing the layout and a cross-sectional view of the display panel.

FIG. 5 is a view schematically showing a part of the plan view of FIG. 4 showing the layout and a cross-sectional view of the display panel.

FIG. 5 shows a part of the plan view of FIG. 4 showing the layout in which the first color pixel PX1 and the second color pixel PX2 are alternately arranged in the first row. The light-emitting element EL and the photo sensing element PD disposed in the cross-sectional view of FIG. 5 will be described based on the emission area EA and the effective sensing area RA.

Referring to FIG. 5, the first color pixel PX1, the second color pixel PX2 and the photo sensor PS may be disposed in the display area DA and the photo sensing area PSA. The light-emitting element EL of each of the first color pixel PX1 and the second color pixel PX2 may be disposed in the emission area EA of the display area DA. The photo sensing element PD of the photo sensor PS may be disposed in the effective sensing area RA of the photo sensing area PSA.

In the schematic cross-sectional view of the display panel 10 according to each pixel PX, the display panel 10 may include a transistor layer 100, an element layer 200 disposed on the transistor layer 100, and a protective layer 300 disposed on the element layer 200.

The transistor layer 100 may include a driver circuit DC for driving the pixel PX and the photo sensor PS in the display area DA and the photo sensing area PSA. As shown in FIG. 3, the display circuit DC1, the sensing circuit DC2, and a variety of signal lines may be formed in the transistor layer 100. In some embodiments, the transistor layer 100 may include the first and second transistors for driving the pixel PX, or the third transistor for driving the photo sensor PS.

The element layer 200 may be disposed on the transistor layer 100 and may include a light-emitting element EL and a photo sensing element PD. When the photoelectric conversion layer of the photo sensing element PD overlaps the emissive layer of the light-emitting element EL in the vertical direction, the effective sensing area RA and the emission area EA may at least partially overlap each other. Although a first contact hole H1 (see FIG. 7) and a second contact hole H2 (see FIG. 7) are formed in the emission area EA (see FIG. 7) in the drawings, the present invention is not limited thereto. For example, the first contact hole H1 may be located outside the emission area EA, and the second contact hole H2 may be located outside the emission area EA and the effective sensing area RA.

The light-emitting element EL may include the display pixel electrode 210 (see FIG. 6), the common electrode 230 (see FIG. 6), and the emissive layer 220 (see FIG. 6) interposed therebetween. The display pixel electrode is disposed in each of the pixels PX and may be connected to at least one transistor forming the display circuit DC1 of the transistor layer 100.

When a voltage or current is applied from the transistor layer 100 to the display pixel electrode 210, the current flows from the display pixel electrode 210 to the common electrode 230, and electron-hole pairs are generated in the emissive layer 220 meanwhile, so that light is emitted.

The photo sensing element PD may include the common electrode 230 (see FIG. 6), the sensing electrode 250 (see FIG. 6), and the photoelectric conversion layer 240 (see FIG. 6) interposed therebetween. The sensing electrode 250 may be disposed in each of the unit photo sensor PS, and may be connected to at least one transistor forming the sensing circuit DC2 of the transistor layer 100. In some embodiments, the common electrode 230 may be shared by the light-emitting element EL and the photo sensing element PD. For example, the light-emitting element EL and the photo sensing element PD may vertically overlap each other, and the common electrode 230, as part of the light-emitting element EL and the photo sensing element PD, may be disposed between the light-emitting element EL and the photo sensing element PD.

The photoelectric conversion layer 240 may generate electric charges according to the amount of received light. The photoelectric conversion layer 240 may include or may be formed of, for example, a photoelectric conversion material. When light is provided to the photoelectric conversion layer 240, the photoelectric conversion layer 240 may generate electron-hole pairs. The generated electric charges may be utilized to detect a sensing signal.

According to the embodiment of the present invention, the display pixel electrode 210 has reflective properties, the common electrode 230 has transparent properties, and the sensing electrode 250 has transparent properties. Accordingly, light may travel from the emissive layer 220 toward the front side (toward the common electrode). The light traveling toward the front side may pass through the photo sensing element PD and may exit to the outside. A part of the light exiting to the outside may be reflected by an external object (e.g., the fingerprint 30) and may be incident on the sensing electrode 250 again. Since the sensing electrode 250 has light-transmitting properties, the reflected light may be incident on the photoelectric conversion layer 240. The light incident on the photoelectric conversion layer 240 again by reflection may generate a first sensing value that is a sensing value of a reflected light. While the light is transmitted through the photo sensing element PD and exits to the outside, a part of the light may be incident on the photoelectric conversion layer 240 to generate a second sensing value that is a reference light sensing value. In the driver circuit DC of the display device 1, both the second sensing value that is the reference sensing value and the first sensing value that is the sensing value of a reflected light may be provided. The driver circuit DC may measure the amount of incident light by reflection by extracting the magnitude of the second sensed value that is the reflected light sensed value excluding the second sensed value.

A process of identifying the fingerprint 30 by the photo sensing element PD based on the incident light will be described. The fingerprint 30 includes ridges R and valleys V between the ridges R having a particular pattern. When the fingerprint 30 is in contact with the upper surface of the protective layer 300, the ridges R of the fingerprint 30 are in contact with the upper surface of the element layer 200 whereas the valleys V of the fingerprint 30 are not in contact with the element layer 200. For example, the upper surface of the element layer 200 is in contact with air where the valleys V are located.

Since the refractive index of the fingerprint 30 is different from the refractive index of air, the amount of light L11 reflected at the region of the upper surface of the element layer 200 contacting the valleys V is different from the amount of light L12 reflected at the region contacting the ridges R. Accordingly, the ridges R and the valleys V of the fingerprint 30 can be derived based on a difference in the amounts of reflected lights L11 and L12, i.e., the lights incident on the photoelectric conversion element PD. The photo sensing element PD can identify the fingerprint 30 of a finger by outputting the optical characteristic having the difference as a sensing signal having an electrical signal.

The protective layer 300 may be disposed on the element layer 200. The protective layer 300 has transparent properties. The protective layer 300 may include an encapsulation layer. In some embodiments, the protective layer 300 may further include a light-blocking pattern for adjusting a small amount of light, or a cover window for protecting the display panel 10.

According to this embodiment, the light sensing element PD and the light-emitting element EL are not disposed on the same plane, but are disposed vertically, so that it is possible to ensure a space in which a plurality of unit light sensors PS can be disposed. Since light generated in the emissive layer 220 can transmit and exit, and is incident on the photoelectric conversion layer 240, the fingerprint 30 can be recognized by detecting a sensing signal. Accordingly, the display device 1 according to the embodiment can allow photo sensing as well as images to be displayed at a high resolution.

Figure 6:
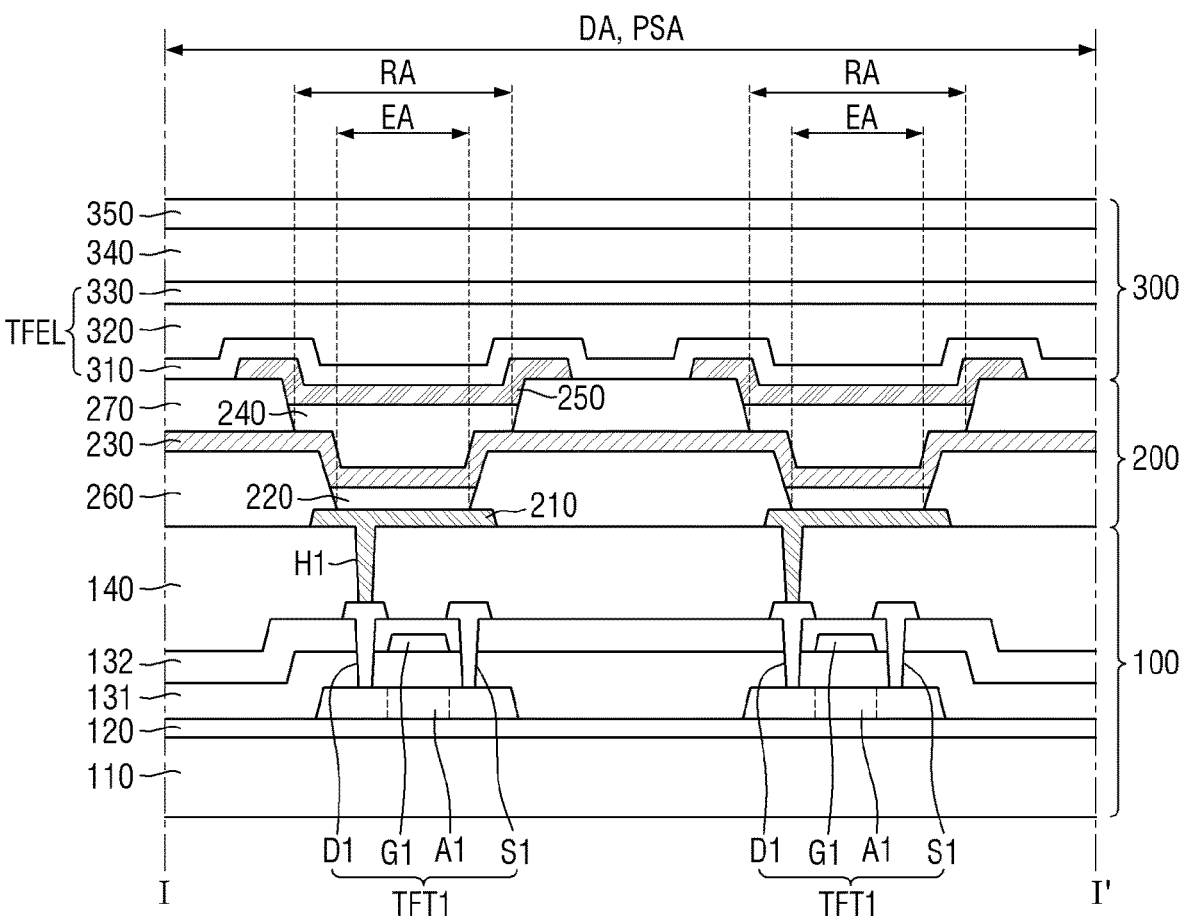
FIG. 6 is a cross-sectional view taken along line I-I' of FIG. 5.
Figure 7:
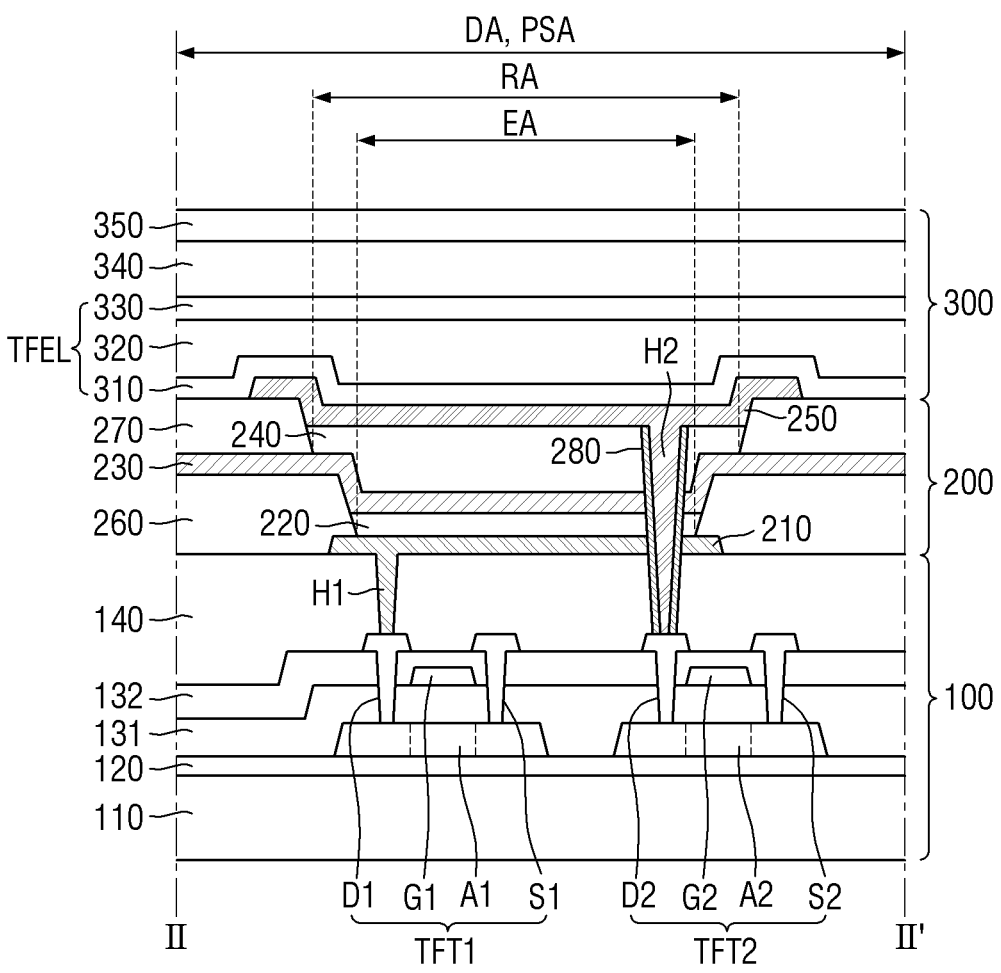
FIG. 7 is a cross-sectional view taken along line II-II' of FIG. 5.

FIG. 6 is a cross-sectional view taken along line I-I' of FIG. 5. FIG. 7 is a cross-sectional view taken along line II-II' of FIG. 5.

In FIGS. 6 and 7, only one of the plurality of thin-film transistors included in the transistor layer 100 is depicted for each pixel for convenience of illustration. The first thin-film transistor TFT1 represents the first transistor of FIG. 3, and the second thin-film transistor TFT2 represents the third transistor of FIG. 3. The plurality of thin-film transistors may be made of substantially the same material as each other.

Referring to FIGS. 6 and 7, the transistor layer 100 may include a substrate 110; a buffer layer 120; a first thin-film transistor TFT1 including a first semiconductor layer A1, a first gate electrode G1, a first source electrode S1 and a first drain electrode D1; a second thin-film transistor TFT2 including a second semiconductor layer A2, a second gate electrode G2, a second source electrode S2 and a second drain electrode D2; and a gate insulating layer 131, an interlayer dielectric film 132 and a planarization layer 140 disposed therebetween.

The substrate 110 supports the layers disposed thereon. The substrate 110 may be made of an insulating material such as a polymer resin. Examples of the polymer material may include polyethersulphone (PES), polyacrylate (PA), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), or a combination thereof.

The buffer layer 120 is disposed on the substrate 110. The buffer layer 120 may include or may be formed of silicon nitride (SiNx), silicon oxide (SiOx), or silicon oxynitride.

The first thin-film transistor TFT1 and the second thin-film transistor TFT2 may be disposed on the buffer layer 120.

The first and second thin-film transistors TFT1 and TFT2 may include first and second semiconductor layers A1 and A2; a gate insulating layer 131 partially disposed on the first and second semiconductor layers A1 and A2; first and second gate electrodes G1 and G2 on the gate insulating layer 131; an interlayer dielectric film 132 covering the first and second semiconductor layers A1 and A2 and the first and second gate electrodes G1 and G2; and first and second source electrodes S1 and S2 and first and second drain electrodes D1 and D2 on the interlayer dielectric film 132, respectively.

The first semiconductor layer A1 and the second semiconductor layer A2 may form channels of the first thin-film transistor TFT1 and the second thin-film transistor TFT2, respectively. The first semiconductor layer A1 may include or may be formed of polycrystalline silicon. According to an embodiment, the semiconductor layer may include or may be formed of monocrystalline silicon, low-temperature polycrystalline silicon, amorphous silicon, or an oxide semiconductor. The oxide semiconductor may include or may be formed of, for example, a binary compound (ABx), a ternary compound (ABxCy) and a quaternary compound (ABxCyDz) containing indium, zinc, gallium, tin, titanium, aluminum, hafnium (Hf), zirconium (Zr), magnesium (Mg), or the like. Each of the semiconductor layers A1 and A2 may include a channel region, and a source region and a drain region doped with impurities.

The gate insulating layer 131 is disposed on the first semiconductor layer A1 and the second semiconductor layer A2. The gate insulating layer 131 electrically insulates the first gate electrode G1 from the first semiconductor layer A1 and electrically insulates the second gate electrode G2 from the second semiconductor layer A2. The gate insulating layer 131 may be made of an insulating material, for example, silicon oxide (SiOx), silicon nitride (SiNx), metal oxide, or the like.

The first gate electrode G1 of the first thin-film transistor TFT1 and the second gate electrode G2 of the second thin-film transistor TFT2 are disposed on the gate insulating layer 131. The first gate electrode G1 and the second gate electrode G2 may be formed above the channel regions of the first semiconductor layer A1 and the second semiconductor layer A2, respectively, i.e., at such positions on the gate insulating layer 131 that they overlap the channel regions.

The interlayer dielectric film 132 may be disposed over the first gate electrode G1 and the second gate electrode G2. The interlayer dielectric film 132 may include or may be formed of inorganic insulating materials such as silicon oxide (SiOx), silicon nitride (SiNx), silicon oxynitride, hafnium oxide and aluminum oxide. Although not shown in the drawings, the interlayer dielectric film 132 may include a plurality of insulating films, and may further include a conductive layer forming a second electrode of a capacitor between the insulating films.

The first source electrode S1 and the first drain electrode D1 of the first thin-film transistor ST1 and the second source electrode S2 and the second drain electrode D2 of the second thin-film transistor ST2 are disposed on the interlayer dielectric film 132. The first source electrode S1 may be electrically connected to the source region of the first semiconductor layer A1 through a contact hole penetrating the interlayer dielectric film 132 and the gate insulating layer 131. The first drain electrode D1 may be electrically connected to the drain region of the first semiconductor layer A1 through a contact hole. The second source electrode S2 and the second drain electrode D2 may also be electrically connected to the source region and the drain region of the second semiconductor layer A2, respectively. The first and second source electrodes S1 and S2 and the first and second drain electrodes D1 and D2 may include or may be formed of at least one metal selected from the group consisting of: aluminum (Al), molybdenum (Mo), platinum (Pt), palladium (Pd), silver (Ag), magnesium (Mg), gold (Au), nickel (Ni), neodymium (Nd), iridium (Jr), chromium (Cr), calcium (Ca), titanium (Ti), tantalum (Ta), tungsten (W) and copper (Cu). The data conductive layer 160 may be made up of a single film or multiple films. For example, the data conductive layer 160 may have a stack structure of Ti/Al/Ti, Mo/Al/Mo, Mo/AlGe/Mo, and Ti/Cu.

The planarization layer 140 may be formed on the interlayer dielectric film 132 to cover the first and second source electrodes S1 and S2 and the first and second drain electrodes D1 and D2. The planarization layer 140 may be made of an organic insulating material, or the like. The planarization layer 140 may have a flat surface and may include the first contact hole H1 exposing one of the first source electrode S1 and the first drain electrode D1. The planarization layer 140 may include the second contact hole H2 exposing one of the second source electrode S2 and the second drain electrode D2.

The element layer 200 may include the light-emitting element EL and the photo sensing element PD. In some embodiments, the element layer 200 may include the display pixel electrode 210, the first bank layer 260, the emissive layer 220, the common electrode 230, a second bank layer 270, the photoelectric conversion layer 240 and the sensing electrode 250.

The display pixel electrode 210 may be disposed on the planarization layer 140 and may be disposed in each of the pixels PX. The display pixel electrode 210 may be connected to the first source electrode S1 or the first drain electrode D1 of the first thin-film transistor TFT1 through the first contact hole H1.

The display pixel electrode 210 may have, but is not limited to, a stack of films of: a material having a high work function, e.g., indium-tin-oxide (ITO), indium-zinc-oxide (IZO), zinc oxide (ZnO), and indium oxide (In$_2$O$_3$); and a material having reflectance, e.g., silver (Ag), magnesium (Mg), aluminum (Al), platinum (Pt), lead (Pb), gold (Au), nickel (Ni) or a mixture thereof. The material having a high work function may be disposed higher than the reflective material to face the cathode electrode (i.e., the common electrode 230) of the light-emitting element EL. The display pixel electrode 210 may have, but is not limited to, a multilayer structure of ITO/Mg, ITO/MgF, ITO/Ag, and ITO/Ag/ITO.

The reflective material of the display pixel electrode 210 may guide the light that travels toward the rear side (toward the display pixel electrode 210) toward the front side (toward the common electrode 230) for top emission.

The first bank layer 260 may be disposed on the display pixel electrode 210. The first bank layer 260 may include a first opening that exposes the display pixel electrode 210. The first opening provides a space in which the emissive layer 220 of each pixel PX is formed, and an area where the exposed display pixel electrode 210 and the emissive layer 220 overlap each other may be defined as the emission area EA. The first bank layer 260 may include or may be formed of an organic insulating material such as polyacrylate resin, epoxy resin, phenolic resin, polyamide resin, polyimide resin, unsaturated polyesters resin, poly phenylen ether resin, poly phenylene sulfide resin, and benzocyclobutene (BCB). In some embodiments, the first bank layer 260 may include or may be formed of an inorganic material such as silicon nitride.

The emissive layer 220 may be disposed on the display pixel electrode 210 exposed by the first opening of the first bank layer 260. The emissive layer 220 may be interposed between the display pixel electrode 210 which is the anode electrode of the light-emitting element EL and the common electrode 230 which is the cathode electrode of the light-emitting element EL. The emissive layer 220 may include or may be formed of a high-molecular material or a low-molecular material, and may emit red, green and blue lights from the pixels SPX, respectively. The light emitted from the emissive layer 220 may contribute to image display or function as a light source of the photo sensor PS.

Although the area in which the emissive layer 220 is disposed is substantially identical to the emission area EA, the emissive layer 220 may be extended beyond the emission area EA to cover the first bank layer 260. Terms such as "same," "equal," "planar," or "coplanar," as used herein encompass near identicality including variations that may occur, for example, due to manufacturing processes. The term "substantially" may be used herein to emphasize this meaning, unless the context or other statements indicate otherwise.

When the emissive layer 220 is formed of an organic material, a hole injecting layer (HIL) and a hole transporting layer (HTL) may be disposed under each emissive layer 220, and an electron injecting layer (EIL) and an electron transporting layer (ETL) may be disposed on each emissive layer 220. Each of the HIL, HTL, EIL, and ETL may have a single-layer or multi-layer structure including an organic material.

The common electrode 230 may be disposed on the emission layer 220 and the first bank layer 260. The common electrode 230 may be disposed across the plurality of pixels PX to cover the emissive layer 220 and the first bank layer 260. For example, the common electrode 230 may not be separated but may be formed across the pixels PX.

The common electrode 230 may be a cathode electrode of the light-emitting element EL that provides electrons to the emissive layer 220. Besides, the common electrode 230 may be the anode electrode of the photo sensing element PD receiving the holes generated in the photoelectric conversion layer 240. For example, the common electrode 230 may be used as the cathode electrode of the light-emitting element EL as well as the anode electrode of the photo sensing element PD.

The common electrode 230 may have a structure having two or more materials. The lower portion of the common electrode 230 may include or may be formed of a conductive material having a low work function, for example, Li, Ca, LiF/Ca, LiF/Al, Al, Mg, Ag, Pt, Pd, Ni, Au, Nd, Ir, Cr, BaF, Ba, or a compound or mixture thereof, (e.g., a mixture of Ag and Mg). The upper portion of the common electrode CE may include or may be formed of a transparent metal oxide having a high work function and transparent properties, for example, indium-tin-oxide (ITO), indium-zinc-oxide (IZO), zinc oxide (ZnO), or the like. The lower material of the common electrode 230 having a low work function may work as the cathode electrode of the light-emitting element EL, and the upper portion including a transparent material may work as the anode electrode of the photo sensing element PD.

The lower material of the common electrode 230 may be formed as a thin film to increase light transmission efficiency. The common electrode 230 may have transparent properties so that light can exit from the emissive layer 220 toward the front side.

The second bank layer 270 may be disposed on the common electrode 230. The second bank layer 270 may include a second opening that exposes the common electrode 230. The second opening may provide a space in which the photoelectric conversion layer 240 of the photo sensor PS is formed. An area where the photoelectric conversion layer 240 overlaps the exposed common electrode 230 may be defined as the effective sensing area RA. Similar to the first bank layer 260, the second bank layer 270 may include or may be formed of an organic insulating material, an inorganic material or the like.

The photoelectric conversion layer 240 may be disposed on the common electrode 230 exposed by the second opening of the second bank layer 270. The photoelectric conversion layer 240 may be interposed between the common electrode 230 that is the anode electrode of the photo sensing element PD and the sensing electrode 250 that is the cathode electrode. The photoelectric conversion layer 240 may generate photocharges in proportion to the incident light. The incident light may be light that is emitted from the emissive layer 220, reflected and entered, or may be light provided from the outside irrespectively of the emissive layer 220. The charges thus generated and accumulated may be converted into electrical signals required for sensing. When the photo sensing element PD is exposed to external light, the photoelectric conversion layer 240 may generate photocharges in proportion to the amount of the external light.

The photoelectric conversion layer 240 may include electron donors and electron acceptors. The electron donors may generate donor ions in response to light, and the electron acceptors may generate acceptor ions in response to light. When the photoelectric conversion layer 240 is formed of an organic material, the electron donors may include or may be, but is not limited to, a compound such as subphthalocyanine (SubPc) and dibutylphosphate (DBP). The electron acceptors may include or may be, but is not limited to, a compound such as fullerene, a fullerene derivative, and perylene diimide. The photoelectric conversion layer 240 may be disposed on the emissive layer 220, and may vertically overlap in the thickness direction with the emissive layer 220 entirely or partially. The effective sensing area RA and the emission area EA may overlap each other, and the effective sensing area RA may be larger than the emission area EA.

Herein, the area in which the photoelectric conversion layer 240 is disposed is substantially identical to the effective sensing area RA, but the photoelectric conversion layer 240 may be extended beyond the effective sensing area RA to cover the second bank layer 270.

When the photoelectric conversion layer 240 is formed of an organic material, a hole injecting layer (HIL) and a hole transporting layer (HTL) may be disposed under each photoelectric conversion layer 240, and an electron injecting layer (EIL) and an electron transporting layer (ETL) may be disposed on each photoelectric conversion layer 240. Each of HIL, HTL, EIL, and ETL may have a single-layer or multi-layer structure including an organic material.

The sensing electrode 250 may be disposed on the photoelectric conversion layer 240 and the second bank layer 270. The sensing electrode 250 may be disposed to cover the photoelectric conversion layer 240 and a part of the second bank layer 270 in the photo sensing area PSA. The sensing electrode 250 may be disposed in each of the photo sensors PS.

The sensing electrode 250 may be made of the same material as the common electrode 230 and may have transparent properties. The lower portion of the sensing electrode 250 may include or may be formed of a conductive material having a low work function, and the upper portion of the sensing electrode 250 may further include a transparent metal oxide, which is a conductor for lowering the resistance of the conductive material.

The sensing electrode 250 is transparent, and the light emitted from the light-emitting element EL can be emitted toward the front side through the sensing electrode 250. The light reflected by a fingerprint 30 (see FIG. 5) can be incident on the photoelectric conversion layer 240. Accordingly, the light incident on the photoelectric conversion layer 240 may be detected as a sensing signal having an electrical signal.

The sensing electrode 250 may be connected to a second source electrode S2 or a second drain electrode D2 of a second thin-film transistor TFT2 through a second contact hole H2. The second contact hole H2 may penetrate through all of the photoelectric conversion layer 240, the common electrode 230, the emissive layer 220, the display pixel electrode 210 and the planarization layer 140 to expose the second source electrode S2 or the second drain electrode D2. The sensing electrode 250 may be electrically connected to the second thin-film transistor TFT2 by filling the second contact hole H2. The sensing electrode 250 may be a cathode electrode of the photo sensing element PD receiving electrons generated from the photoelectric conversion layer 240 by receiving a signal applied from the second thin-film transistor TFT2. In some embodiments, the second contact hole H2 may penetrate through the common electrode 230, the first bank layer 260 and the planarization layer 140 to expose the second source electrode S2 or the second drain electrode D2.

The second contact hole H2 may be formed via a laser process or an etching process. The laser process may be carried out by using nano laser, pico laser, femto laser, laser drilling, or the like. It should be understood, however, that the present invention is not limited thereto. Any of a variety of processes may be applied as long as the light emission and light sensing functions of the display device 1 are not compromised.

Although the second contact hole H2 penetrates through the photoelectric conversion layer 241, the common electrode 230, the emissive layer 220 and the display pixel electrode 210 in the drawings, but the present invention is not limited thereto. For example, the second contact hole H2 is formed at a portion of the sensing electrode 250 contacting the second bank layer 270, to penetrate through the second bank layer 270, the common electrode 230 and the first bank layer 260.

A passivation film 280 may be formed on the inner wall of the second contact hole H2 filled with the sensing electrode 250. The passivation film 280 may electrically insulate the sensing electrode 250 from other conductive electrodes (e.g., the display pixel electrode 210 or the common electrode 230). The passivation film 280 may be formed of an inorganic insulating material such as silicon nitride and silicon oxide.

A protective layer 300 is disposed above the light-emitting element EL and the photo sensing element PD. The protective layer 300 may include an encapsulation layer TFEL and a cover window 350 on the encapsulation layer TFEL.

The encapsulation layer TFEL disposed above the light-emitting element EL and the photo sensing element PD may include or may be formed of at least one inorganic encapsulation layer and at least one organic encapsulation layer. For example, the encapsulation layer TFEL may include a first inorganic encapsulation layer 310 disposed on the second bank layer 270 and the sensing electrode 250, an organic encapsulation layer 320 disposed on the first inorganic encapsulation layer 310, and a second inorganic encapsulation layer 330 disposed on the organic encapsulation layer 320.

The first inorganic encapsulation layer 310 and the second inorganic encapsulation layer 330 may be formed of, but is not limited to, a silicon nitride layer, a silicon oxynitride layer, a silicon oxide layer, a titanium oxide layer, or an aluminum oxide layer. The organic encapsulation layer 320 may be formed of, but is not limited to, an acryl resin, an epoxy resin, a phenolic resin, a polyamide resin and a polyimide resin.

The cover window 350 is disposed on the encapsulation layer TFEL. The cover window 350 may be in contact with the fingerprint 30. The cover window 350 may be an element that protects the configuration of the display device 1 and transmits light emitted from the emissive layer 220. The cover window 350 may be made of glass, sapphire and/or plastic.

A transparent coupling member 340 may be disposed between the encapsulation layer TFEL and the cover window 350. The transparent coupling member 340 is interposed between the cover window 350 and the encapsulation layer TFEL to couple them. The transparent coupling member 340 may include or may be formed of an optically clear adhesive (OCA) or an optically clear resin (OCR). Although not shown in the drawings, the display device 1 may further include a touch panel TSP, a polarization layer or the like between the encapsulation layer TFEL and the cover window 350.

In the display device 1 according to the embodiment, the pixel PX including the emission area EA and the photo sensor PS including the photo sensing area PSA are not disposed on the same plane but are disposed vertically so that the virtual center point CP of the photo sensor PS is located in the emission area EA, and thus the spacing between the pixels PX and the spacing between the photo sensors PS can be reduced. For example, the spacings of the display device 1 can be substantially equal to spacings of a display device without a light sensing function. As a result, the display device 1 can display images at a high resolution with light sensing Since it is possible to arrange a plurality of photo sensors PS depending on the arrangement structure, the degree of integration of the photo sensors PS increases, and the process can become easier.

According to this embodiment, the display device 1 can have a simpler circuit structure because the light-emitting element EL and the photo sensing element PD share the common electrode 230 so that the second supply voltage ELVSS is applied simultaneously. By reducing the number of electrodes included in the light-emitting element EL and the photo sensing element PD, it is possible to reduce the thickness of the display device 1, to save the processing cost because the process is eliminated, and to simplify the process.

Figure 8:
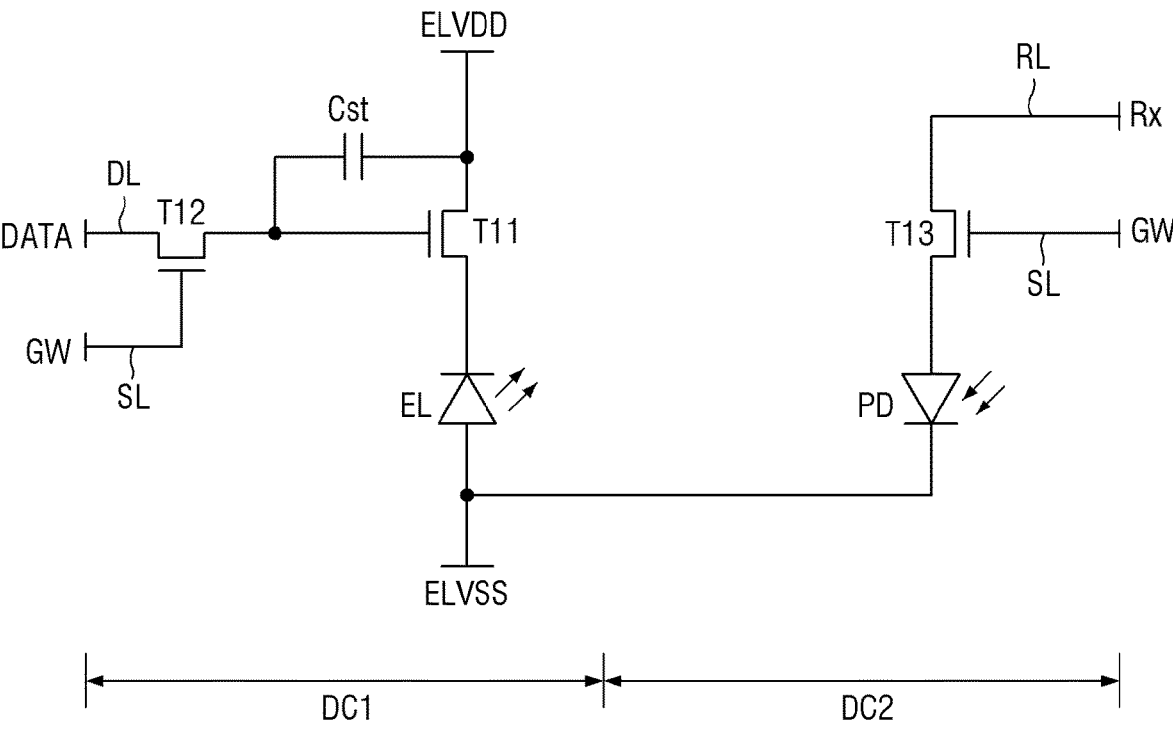
FIG. 8 is a circuit diagram of a pixel and a unit photo sensor of a display device according to an embodiment of the present invention.

FIG. 8 is a circuit diagram of a pixel and a unit photo sensor of a display device according to an embodiment of the present invention.

The driver circuit DC of FIG. 8 is substantially identical to the driver circuit DC of FIG. 3 in that a cathode electrode of a photo sensing element PD is electrically connected to an anode electrode of the light-emitting element EL. According to this embodiment, even though an emissive layer 221 and a photoelectric conversion layer 241 are formed on different layers, the cathode electrode of the photo sensing element PD and the anode electrode of the light-emitting element EL are used by using one common electrode 231. Therefore, it is possible to simplify the device.

Hereinafter, examples having the circuit structure of FIG. 8 will be described.

Figure 9:
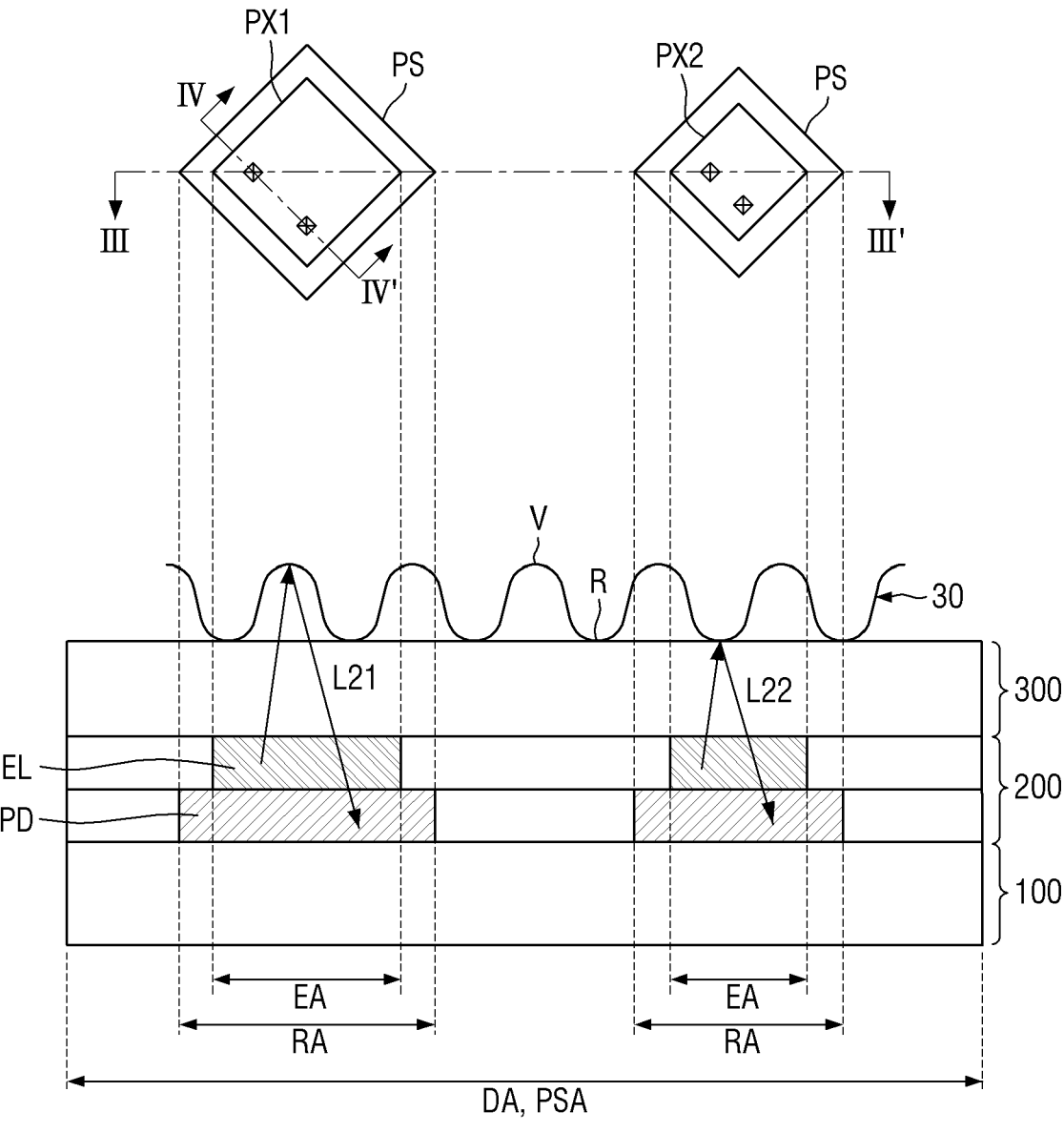
FIG. 9 is a view schematically showing a part of a plan view showing the layout of pixels and photo sensors in a display device according to an embodiment, and a cross-sectional view of the display device.
Figure 10:
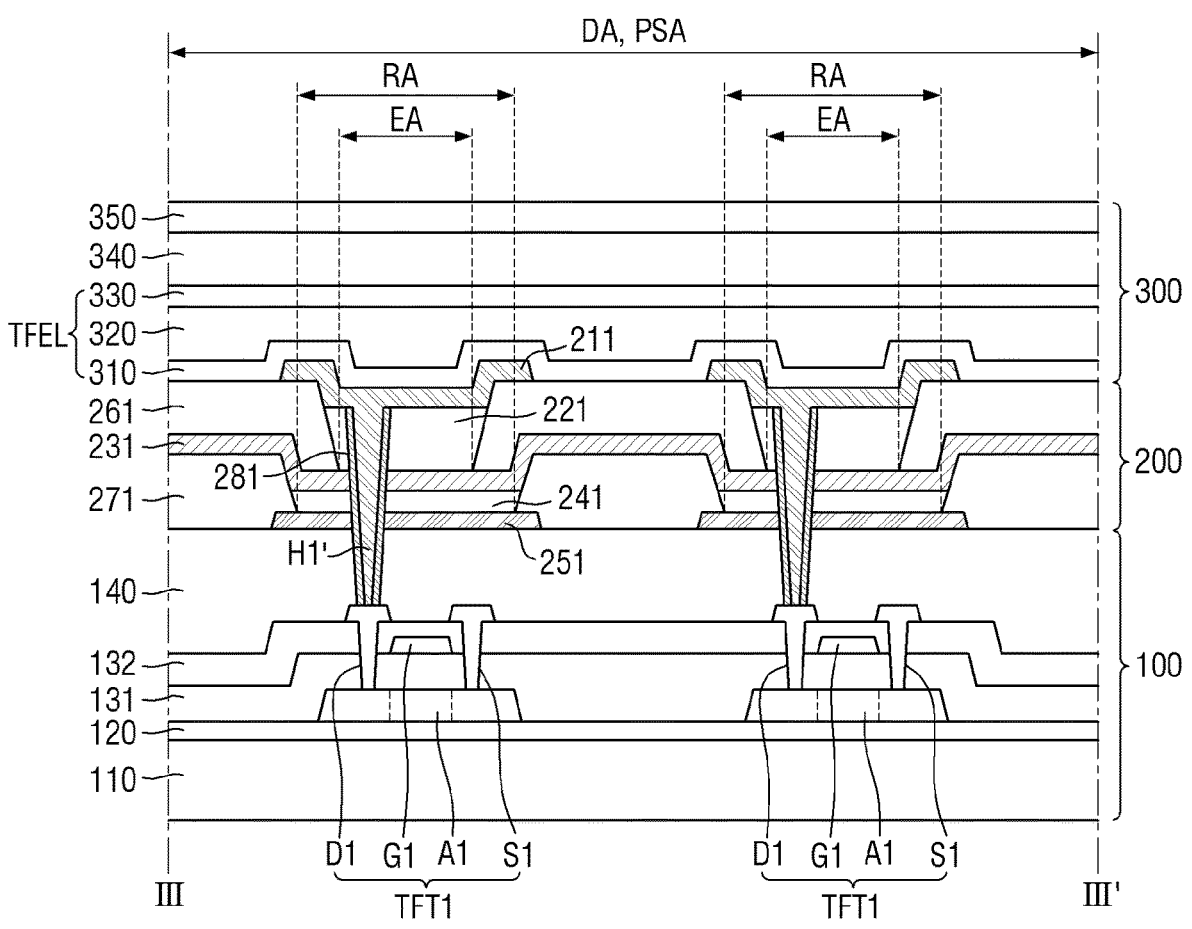
FIG. 10 is a cross-sectional view taken along line III-III' of FIG. 9.
Figure 11:
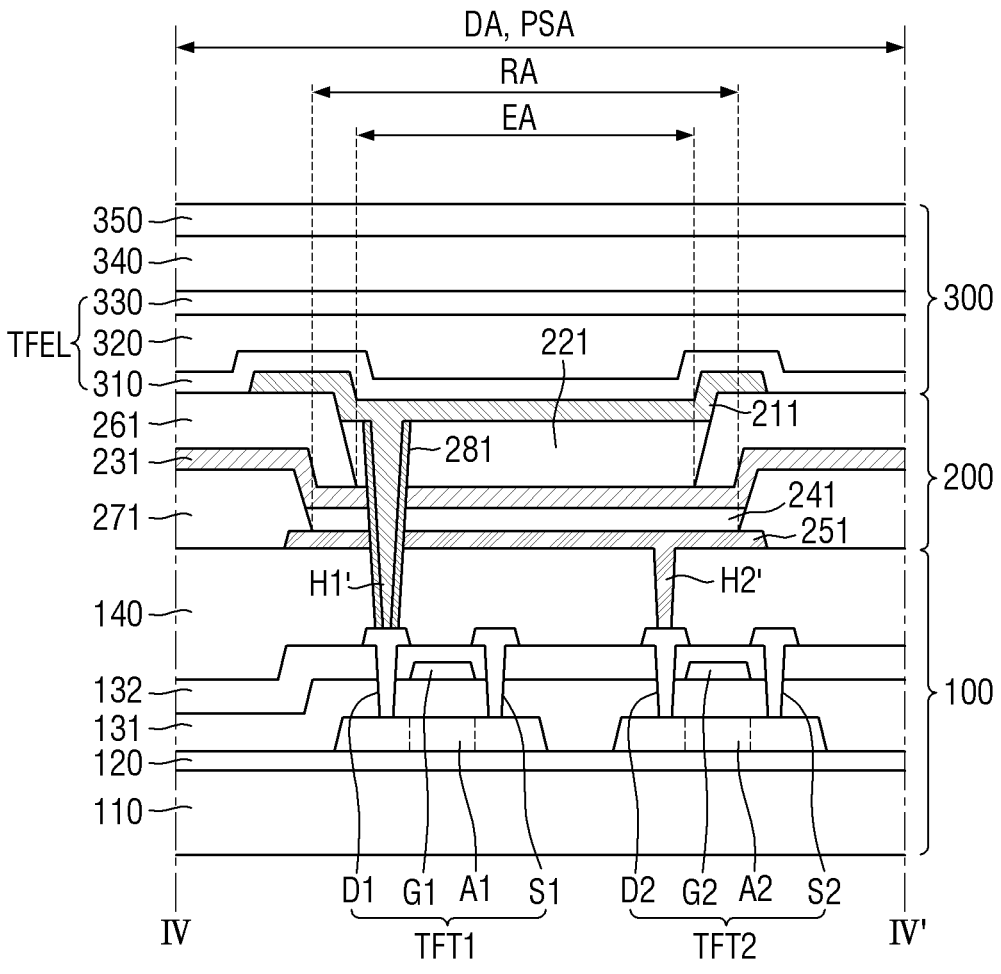
FIG. 11 is a cross-sectional view taken along line IV-IV' of FIG. 9.

FIG. 9 is a view schematically showing a part of a plan view showing the layout of pixels and photo sensors in a display device according to an embodiment, and a cross-sectional view of the display device. FIG. 10 is a cross-sectional view taken along line III-III' of FIG. 9. FIG. 11 is a cross-sectional view taken along line IV-IV' of FIG. 9.

In a display device 1 according to this embodiment, a photo sensing element PD overlaps a light-emitting element EL vertically as in FIGS. 5 to 7, but the photo sensing element PD is disposed under the light-emitting element EL unlike the above-described embodiment. In the plan view showing the layout of the pixel and the photo sensor PS, a virtual center point CP of the photo sensor PS is located in the emission area EA as in FIG. 4.

In some embodiments, the element layer 200 may include the light-emitting element EL disposed on the transistor layer 100, and the photo sensing element PD disposed on the light-emitting element EL. The photo sensing element PD and the light-emitting element EL may overlap each other. The photo sensing element PD may have a larger area than the light-emitting element EL and may completely cover the light-emitting element EL. The edge of the photo sensing element PD may be located more to the outside than the edge of the light-emitting element EL. For example, the edge of the photo sensing element PD may be located beyond the edge of the light-emitting element EL so that when viewed in a plan view, the edge of the photo sensing element PD may surround the edge of the light-emitting element EL.

The photo sensing element PD may include a sensing electrode 251, a common electrode 231 and a photoelectric conversion layer 241 interposed therebetween, and the light-emitting element EL may include a common electrode 231, a display pixel electrode 211 and an emissive layer 221 interposed therebetween.

According to this embodiment of the present invention, the sensing electrode 251 has reflective properties, the common electrode 231 has at least partially transparent properties, and the display pixel electrode 211 has transparent properties. Some of the lights generated in the emissive layer 221 travel toward the front side while some others travel toward the rear side. The light emitted toward the front side may exit to the outside through the display pixel electrode 211. The light emitted toward the rear side may pass through the common electrode 231 and the photoelectric conversion layer 241 of the photo sensing element PD, may be reflected by the sensing electrode 251 having reflective properties, and may travel back to the front side to exit. The light traveling toward the front side may exit to the outside through the photoelectric conversion layer 241, the common electrode 231, the emissive layer 221 and the display pixel electrode 211. As such, some of the lights emitted toward the front side may be reflected by an external object (e.g., the fingerprint 30) and may be incident on the display pixel electrode 211. The incident light may pass through the display pixel electrode 211 and the common electrode 231 having transparent properties to be incident on the photoelectric conversion layer 241.

The light incident on the photoelectric conversion layer 241 again by the reflection may generate a first sensing value that is a sensing value of a reflected light. The light reflected by the photoelectric conversion layer 241 and emitted toward the rear side from the emissive layer 221 may be incident on the photoelectric conversion layer 241 twice by being reflected by the photo sensing element PD. The light that may be incident on the photoelectric conversion layer 241 twice may generate a second sensing value that is a reference light sensing value. In the driver circuit DC of the display device 1, both the second sensing value that is the reference sensing value and the first sensing value that is the sensing value of a reflected light may be provided. The driver circuit DC may measure the amount of incident light by reflection by extracting the magnitude of the second sensed value that is the reflected light sensed value excluding the second sensed value. According to this embodiment, the light sensing element PD and the light-emitting element EL are not disposed on the same plane, but are disposed vertically, so that it is possible to ensure a space in which a plurality of unit light sensors PS can be disposed. Since light generated in the emissive layer 221 can transmit and exit, and is incident on the photoelectric conversion layer 241, the fingerprint 30 can be recognized by detecting a sensing signal. Accordingly, the display device 1 according to the embodiment can allow photo sensing as well as images to be displayed at a high resolution.

Cross-sectional views of the pixel PX and the photo sensor PS will be described with reference to FIGS. 10 and 11. The elements identical to those described above with reference to FIGS. 6 and 7 will not be described.

Referring to FIGS. 10 and 11, a sensing electrode 251 is disposed on a transistor layer 100. The sensing electrode 251 may be disposed on a planarization layer 140, and may be disposed in each photo sensor PS. The sensing electrode 251 may be connected to a second source electrode S2 or a second drain electrode D2 of a second thin-film transistor TFT2 through a second contact hole H2'.

The sensing electrode 251 may include or may be formed of a reflective material. For example, the sensing electrode 251 may have, but is not limited to, a stack of films of: a material having a high work function, e.g., indium-tin-oxide (ITO), indium-zinc-oxide (IZO), zinc oxide (ZnO), and indium oxide (In$_2$O$_3$); and a reflective material, e.g., silver (Ag), magnesium (Mg), aluminum (Al), platinum (Pt), lead (Pb), gold (Au), nickel (Ni) or a mixture thereof. A material layer having a higher work function may be disposed on a higher layer than a reflective material layer so that the material layer may be closer to an emissive layer 221 or a photo sensing layer. The sensing electrode 251 may have, but is not limited to, a multilayer structure of ITO/Mg, ITO/MgF, ITO/Ag, and ITO/Ag/ITO.

The sensing electrode 251 may reflect light that travels toward the rear side through the lower reflective material layer, and the reflected light by the sensing electrode 251 may travel toward the front side (toward the common electrode).

A second bank layer 271 may be disposed on the sensing electrode 251. The second bank layer 271 may include a second opening formed at a portion of an effective sensing area RA to expose the sensing electrode 251.

The photoelectric conversion layer 241 may be disposed on the sensing electrode exposed by the second opening of the second bank layer 271.

A common electrode 231 may be disposed on the photoelectric conversion layer 241 and the second bank layer 271. The common electrode 231 may be disposed entirely on the display area DA and the photo sensing area PSA to cover the photoelectric conversion layer 241 and the second bank layer 271. For example, the common electrode 231 may not be separated but may be formed across the pixels PX.

The common electrode 231 may be the cathode electrode of the photo sensing element PD receiving the electrons generated in the photoelectric conversion layer 241. Beside, the common electrode 231 may be an anode electrode of the light-emitting element EL that provides holes to the emissive layer 221. For example, the common electrode 231 may be used as the cathode electrode of the photo sensing element PD as well as the anode electrode of the light-emitting element EL.

The common electrode 231 may have a structure having two or more materials. A lower layer of the common electrode 231 may include or may be a conductive material layer having a low work function, for example, Li, Ca, LiF/Ca, LiF/Al, Al, Mg, Ag, Pt, Pd, Ni, Au, Nd, Jr, Cr, BaF, Ba, or a compound or mixture thereof, (e.g., a mixture of Ag and Mg). An upper layer of the common electrode 231 may include or may be formed of a transparent metal oxide having a high work function, for example, indium-tin-oxide (ITO), indium-zinc-oxide (IZO), zinc oxide (ZnO), or the like. The lower material of the common electrode 231 having a low work function may work as the cathode electrode of the photo sensing element PD, and the upper portion including a transparent material may work as the anode electrode of the light-emitting element EL.

A first bank layer 261 may be disposed on the common electrode 231. The first bank layer 261 may include a first opening formed at a portion of the emission area EA that overlaps the common electrode 231 to expose the common electrode 231.

The emissive layer 221 may be disposed on the common electrode 231 exposed by the first opening of the first bank layer 261.

A display pixel electrode 211 may be disposed on the emissive layer 221 and the first bank layer 261. The display pixel electrode 211 may be disposed to cover the emissive layer 221 and a part of the first bank layer 261 in the display area DA. The display pixel electrode 211 may be disposed in each pixel PX.

The display pixel electrode 211 may have transparent properties. The lower portion of the display pixel electrode 211 may include or may be formed of a conductive material having a low work function, and the upper portion of the display pixel electrode 211 may include the conductive material having the low work function, which is the same as the lower portion of the display pixel electrode 211, and a transparent metal oxide, which is a conductor for lowering the resistance of the conductive material. In some embodiments, the display pixel electrode 211 may include or may be formed of a conductive material having a low work function, for example, Li, Ca, LiF/Ca, LiF/Al, Al, Mg, Ag, Pt, Pd, Ni, Au, Nd, Ir, Cr, BaF, Ba, or a compound or mixture thereof, (e.g., a mixture of Ag and Mg). The display pixel electrode 211 may further include a transparent metal oxide having a high work function, e.g., indium-tin-oxide (ITO), indium-zinc-oxide (IZO), zinc oxide (ZnO), or the like, on the material layer having the low work function. The con- ductive material having a low work function of the display pixel electrode 211 has a small thickness, and thus the efficiency of the light emitted from the light-emitting ele- ment EL to exit toward the front side of the substrate 110 can be increased. The display pixel electrode 211 may be con- nected to the first source electrode S1 or the first drain electrode D1 of the first thin-film transistor TFT1 through the first contact hole H1'. The first contact hole H1' may penetrate through all of the emissive layer 221, the common electrode 231, the photoelectric conversion layer 241, the sensing electrode 251 and the planarization layer 140 to expose the first source electrode S1 or the first drain elec- trode D1. The first contact hole H1' may be filled with the display pixel electrode 211, and thus the display pixel electrode 211 may be electrically connected to the first thin-film transistor TFT1. The display pixel electrode 211 may be a cathode electrode of the light-emitting element EL that receives a signal applied from the first thin-film tran- sistor TFT1 and provides electrons to the emissive layer 221.

The first contact hole H1' may be formed via a laser process or an etching process like the forming of the second contact hole H2 according to the above-described embodi- ment. Although the first contact hole H1' penetrates through the emissive layer 221, the common electrode 231, the photoelectric conversion layer 241 and the sensing electrode 251 in the drawings, the present invention is not limited thereto. For example, the first contact hole H1' may be formed at a portion of the display pixel electrode 211 contacting the first bank layer 261, and may penetrate through the first bank layer 261, the common electrode 231 and the second bank layer 271.

A passivation film 281 may be formed on the inner wall of the first contact hole H1' filled with the display pixel electrode 211. The passivation film 281 may electrically insulate the display pixel electrode 211 from other conduc- tive electrodes (e.g., the sensing electrode 251 or the com- mon electrode 231). The passivation film 281 may be formed of, e.g., an inorganic insulating material such as silicon nitride and silicon oxide.

A protective layer 300 is disposed above the light-emit- ting element EL and the photo sensing element PD. The protective layer 300 may be formed in a flat shape. The protective layer 300 may include an encapsulation layer TFEL and a cover window 350 on the encapsulation layer TFEL as described above with reference to FIGS. 5 and 6.

In the display device 1 according to this embodiment, the light-emitting element EL and the photo sensing element PD are not disposed on the same plane but are disposed verti- cally so that the virtual center point CP of the photo sensor PS is located in the emission area EA, and thus the spacing between the pixels PX and the spacing between the photo sensors PS can be reduced. For example, the spacings of the display device 1 can be substantially equal to spacings of a display device without a light sensing function. As a result, the display device 1 can display images at a high resolution with a light sensing function.

Since it is possible to arrange a plurality of photo sensors PS depending on the arrangement structure, the degree of integration of the photo sensors PS increases, and the process can become easier.

According to this embodiment, the display device 1 can have a simpler circuit structure because the light-emitting element EL and the photo sensing element PD share the common electrode 231. Since the number of electrodes required for the display device 1 is reduced, the thickness of the display device 1 can be reduced and the process can become simpler.

Figure 12:
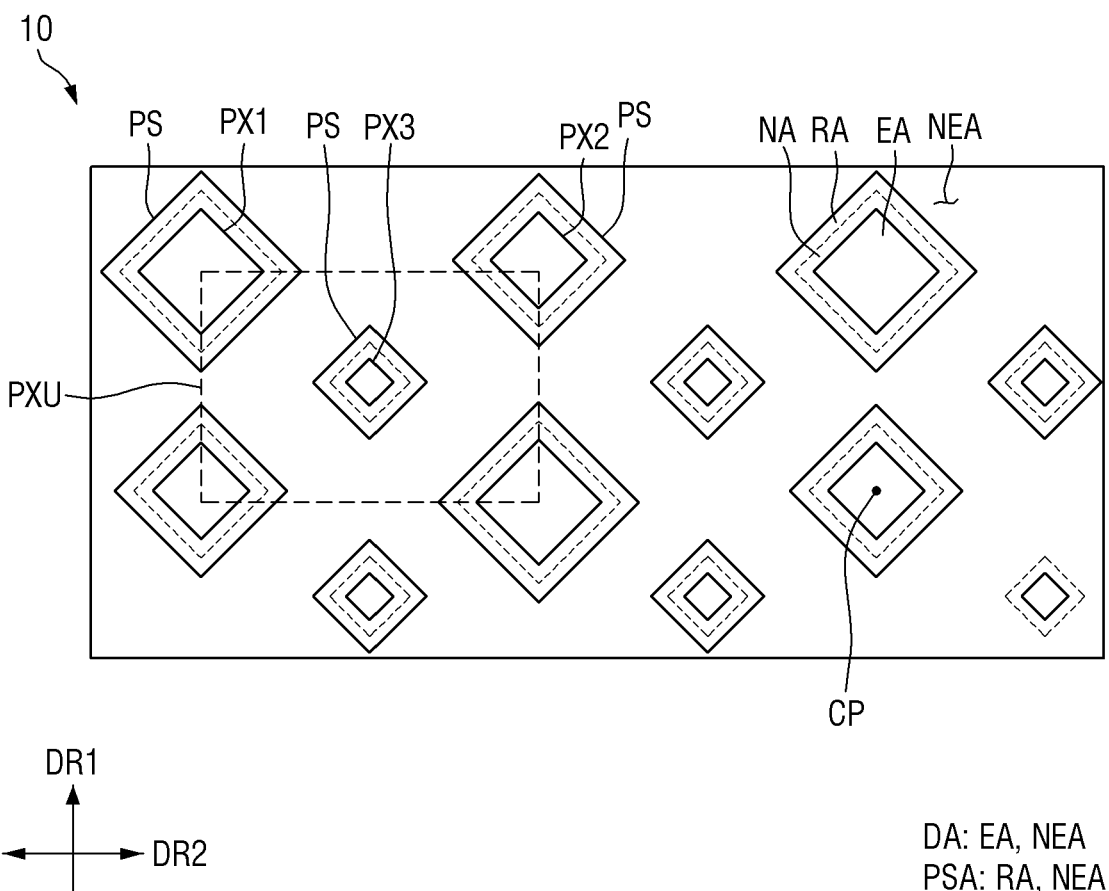
FIG. 12 is a plan view showing a layout of pixels and photo sensors of a display panel according to an embodiment of the present invention.
Figure 13:
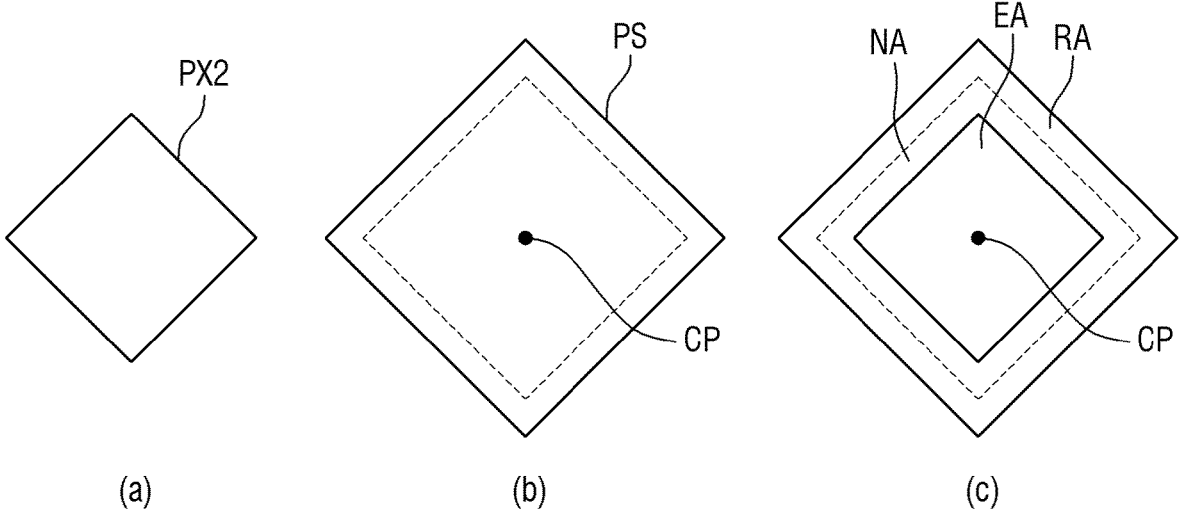
FIG. 13 is a plan view separately showing a pixel and a photo sensor in a display panel according to an embodiment of the present invention.
Figure 14:
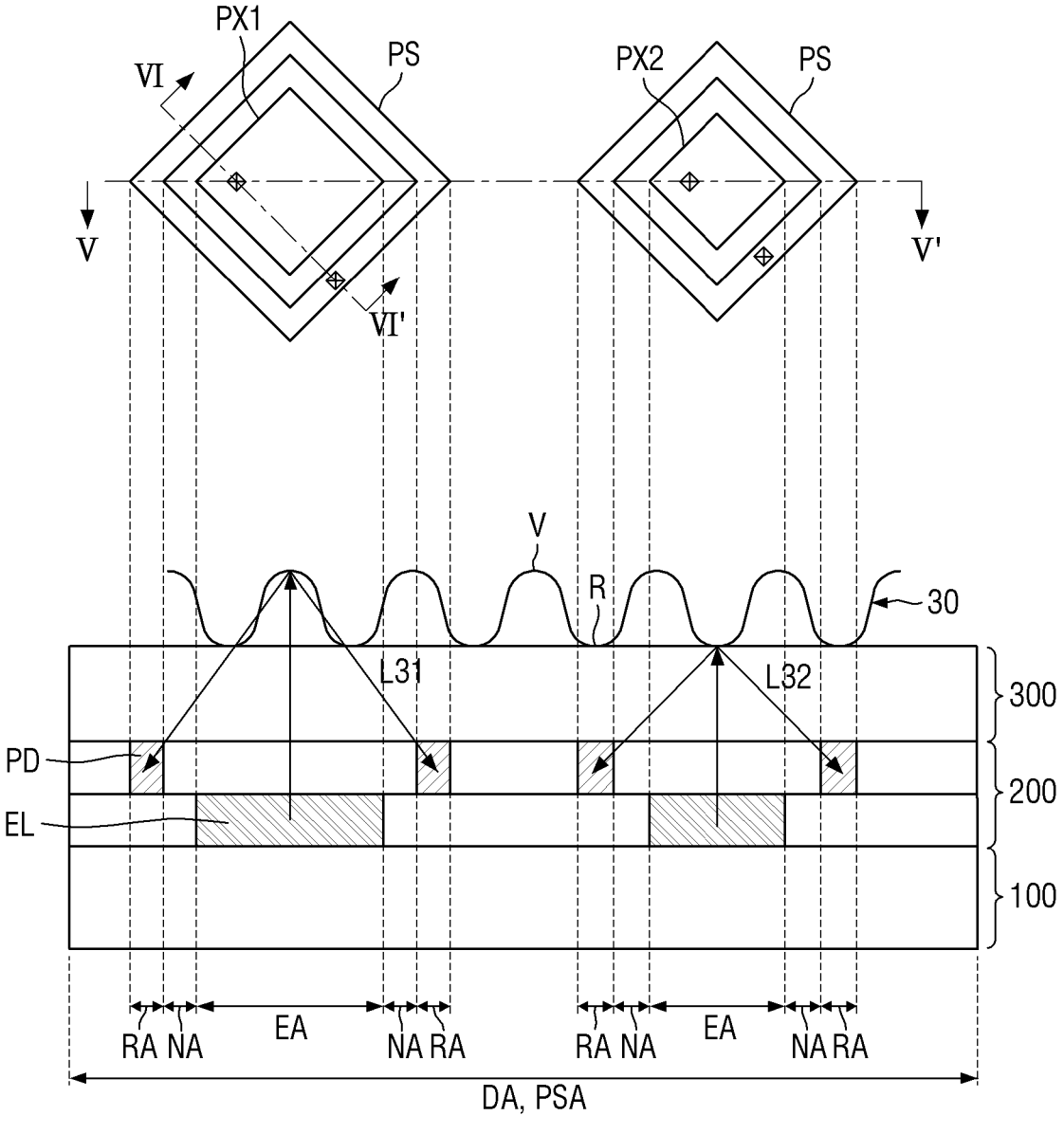
FIG. 14 is a view schematically showing a part of a plan view showing the layout of pixels and photo sensors of FIG. 12 in a display device according to an embodiment of the present invention, and a cross-sectional view of the display panel.
Figure 15:
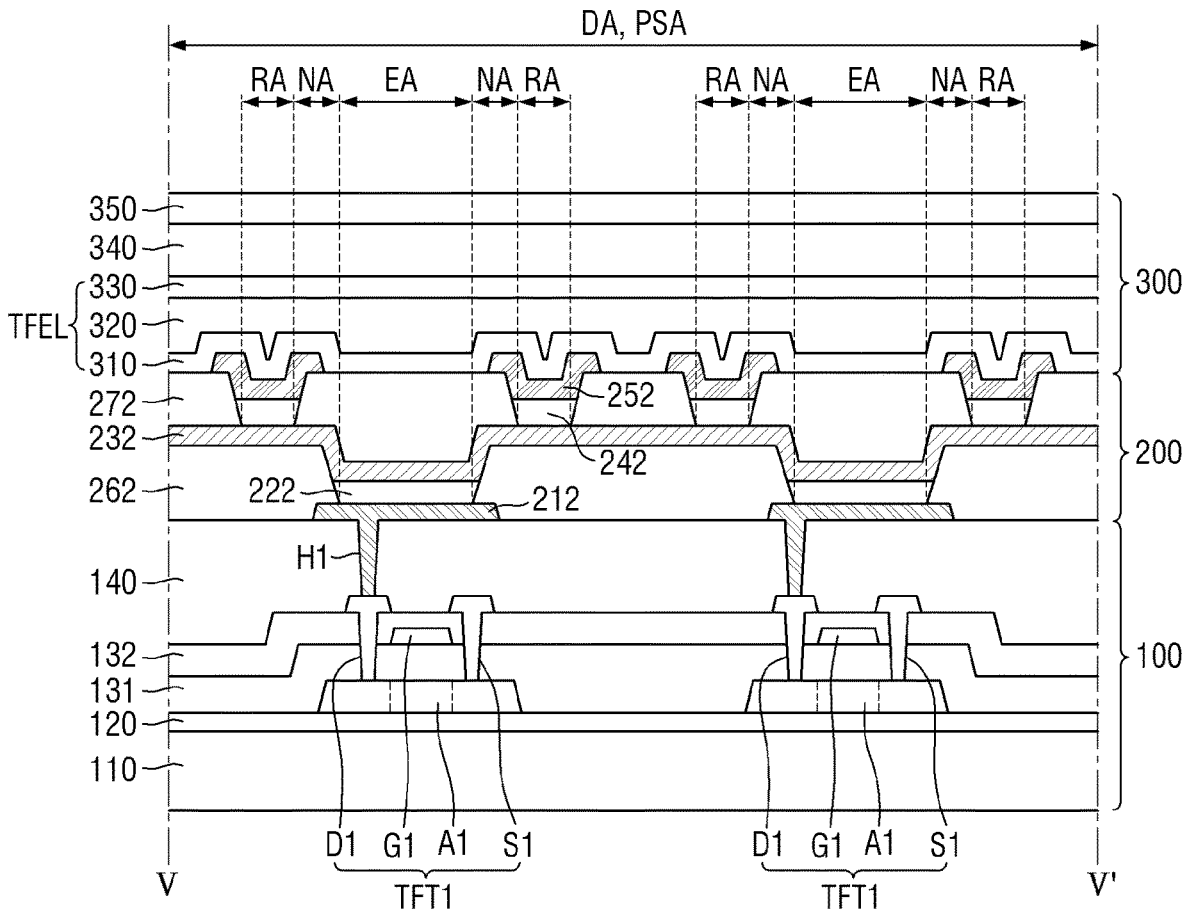
FIG. 15 is a cross-sectional view taken along line V-V' of FIG. 14.
Figure 16:
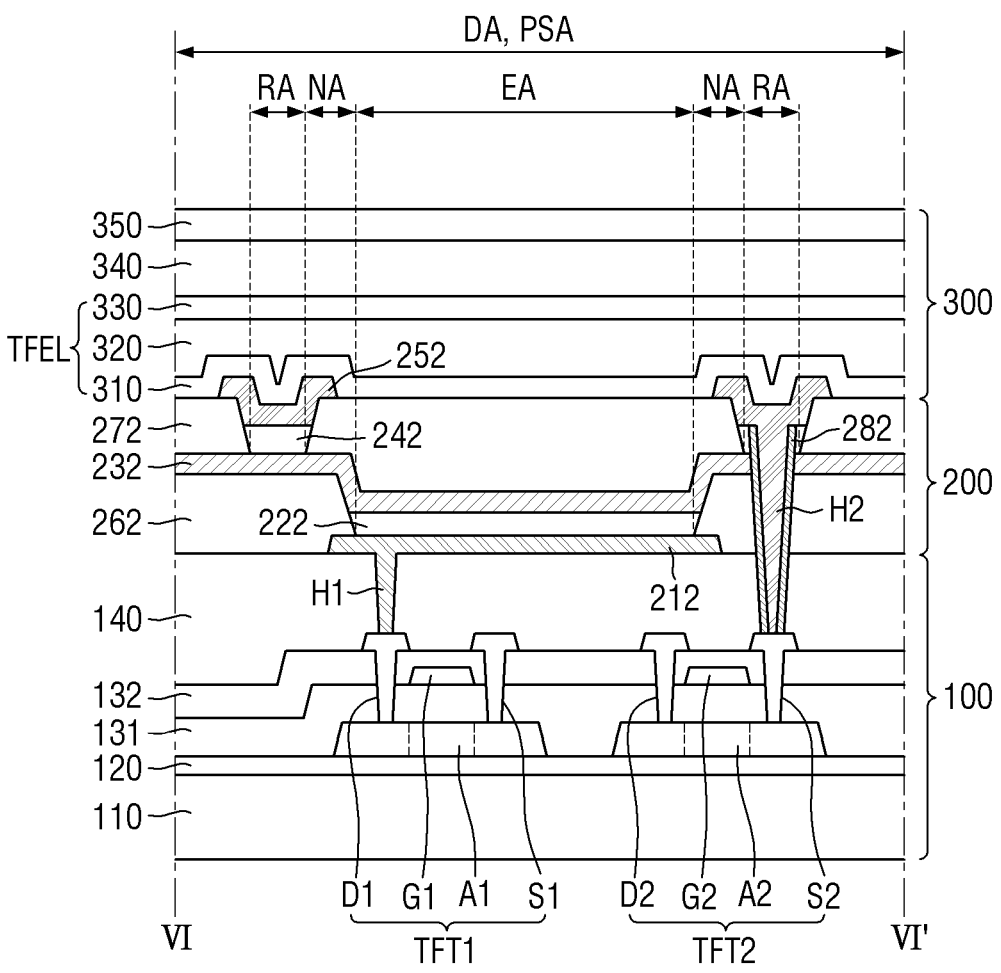
FIG. 16 is a cross-sectional view taken along line VI-VI' of FIG. 14.

Hereinafter, a display device 1 according to an embodi- ment will be described with reference to FIGS. 12 to 16. FIG. 12 is a plan view showing a layout of pixels and photo sensors of a display panel according to an embodiment. FIG. 13 is a plan view separately showing a pixel and a photo sensor in a display panel according to an embodiment of the present invention. FIG. 14 is a view schematically showing a part of a plan view showing the layout of pixels and photo sensors of FIG. 12 in a display device according to an embodiment, and a cross-sectional view of the display device. FIG. 15 is a cross-sectional view taken along line V-V' of FIG. 14. FIG. 16 is a cross-sectional view taken along line VI-VI' of FIG. 14.

In a display device 1 according to this embodiment, a photo sensing element PD is disposed above a pixel as in FIGS. 5 to 7, but a photo sensing element PD of the photo sensor PS does not overlap a light-emitting element EL of the pixel PX but is disposed to surround the light-emitting element EL unlike the above-described embodiment. In the plan view showing the layout of the pixel PX and the photo sensor PS, a virtual center point CP of the photo sensor PS is located in the emission area EA as in FIG. 4.

In the display device 1 according to this embodiment, the emission area EA and the effective sensing area RA may not overlap each other. An avoidance area NA may be further included between the emission area EA and the effective sensing area RA. Similar to the peripheral area NEA, the non-emission area and the non-sensing area may overlap each other in the avoidance area NA. The emissive layer 222 and the photoelectric conversion layer 242 may not be disposed in the avoidance area NA.

An element layer 200 may include the light-emitting element EL disposed on the transistor layer 100, and the photo sensing element PD disposed on the light-emitting element EL to surround the light-emitting element EL. In the plan view, the border (i.e., the outer edge) of the light-emitting element EL may be spaced apart from the outer edge of the photo sensing element PD by the distance equal to the width of the avoidance area NA.

The light-emitting element EL may include a common electrode 232, a display pixel electrode 212, and an emissive layer 222 interposed therebetween. The photo sensing element PD may include a sensing electrode 252, a common electrode 232, and a photoelectric conversion layer 242 interposed therebetween.

According to this embodiment of the present invention, the display pixel electrode 212 has reflective properties, the common electrode 232 is transparent, and the sensing electrode 252 is transparent. Accordingly, light may travel from the emissive layer 222 toward the front side (toward the common electrode). The light traveling toward the front side may exit to the outside directly. A part of the light exiting to the outside may be reflected by an external object (e.g., the fingerprint 30) and may be incident on the sensing electrode 252 again. Since the sensing electrode 252 is transparent, the reflected light may be incident on the photoelectric conversion layer 242. The light incident on the photoelectric conversion layer 242 again by the reflection may generate a first sensing value that is a sensing value of a reflected light. According to the embodiment of the present invention, the light-emitting element EL and the photo sensing element PD do not overlap each other unlike the other embodiments, and the emitted light may exit directly without being incident on the photoelectric conversion layer 242.

A first sensed value that is a sensed value of reflected light is provided to the driver circuit DC of the display device 1, but the second sensed value that is a sensed value of reference light may not be provided thereto or may be provided in a very small amount. Accordingly, a higher sensed value can be extracted, and it is possible to measure the amount of incident light by reflection.

According to this embodiment, the light sensing element PD and the light-emitting element EL are not disposed on the same plane, but are disposed vertically, so that it is possible to ensure a space in which a plurality of unit light sensors PS can be disposed. Since light generated in the emissive layer 222 can transmit and exit, and is incident on the photoelectric conversion layer 242, the fingerprint 30 can be recognized by detecting a sensing signal. Accordingly, the display device 1 according to the embodiment can allow photo sensing as well as images to be displayed at a high resolution.

Cross-sectional views of the pixel PX and the optical sensor PS will be described with reference to FIGS. 15 and

16. The elements identical to those described above with reference to FIGS. 6 and 7 will not be described.

The display pixel electrode 212 may be disposed on the planarization layer 140 and may be disposed in each of the pixels PX. The display pixel electrode 212 may be connected to the first source electrode S1 or the first drain electrode D1 of the first thin-film transistor TFT1 through the first contact hole H1. The lower reflective material and the upper material having a high work function of the display pixel electrode 212 may guide the light that travels toward the rear side (toward the display pixel electrode 212) toward the front side (toward the common electrode 232) for top emission.

The first bank layer 262 may be disposed on the display pixel electrode 212. The first bank layer 262 may include a first opening that exposes the display pixel electrode 212.

The emissive layer 222 may be disposed on the display pixel electrode 212 exposed by the first opening of the first bank layer 262. The emissive layer 222 may be disposed in the emission area EA, and may not be disposed in the avoidance area NA surrounding the emission area EA with a predetermined width.

The common electrode 232 may be disposed on the emission layer 222 and the first bank layer 262. The common electrode 232 may be disposed entirely on the display area DA and the photo sensing area PSA to cover the emissive layer 222 and the first bank layer 262. The common electrode 232 may be the cathode electrode of the light-emitting element EL that supplies electrons to the light-emitting element EL, and may be the anode electrode of the photo sensing element PD receiving holes generated in the photo sensing element PD. For example, the common electrode 232 may be used as the cathode electrode of the light-emitting element EL as well as the cathode electrode of the photo sensing element PD.

The common electrode 232 may have a structure having two or more materials. The lower portion of the common electrode 232 having a low work function may work as the cathode electrode of the light-emitting element EL, and the upper portion including a transparent material may work as the anode electrode of the photo sensing element PD.

The second bank layer 272 may be disposed on the common electrode 232. The second bank layer 272 may include a second opening that exposes the common electrode 232.

The photoelectric conversion layer 242 may be disposed on the common electrode 232 exposed by the second opening of the second bank layer 272. The photoelectric conversion layer 242 may be disposed in the effective sensing area RA, but may not be disposed in the avoidance area NA. The photoelectric conversion layer 242 may be disposed to surround the emission area EA and the avoidance area NA.

The sensing electrode 252 may be disposed on the photoelectric conversion layer 242 and the second bank layer 272. The sensing electrode 252 may be disposed to cover the photoelectric conversion layer 242 and a part of the second bank layer 272 in the photo sensing area PSA. The sensing electrode 252 may be disposed in each of the photo sensors PS.

The sensing electrode 252 may be transparent. The lower portion of the sensing electrode 252 may include a conductive material having a low work function, and the upper portion of the sensing electrode 252 may include the conductive material having the low work function, which is the same as the lower portion of the sensing electrode 252, and a transparent metal oxide, which is a conductor for lowering the resistance of the conductive material of the lower portion of the sensing electrode 252.

The sensing electrode 252 may be connected to a second source electrode S2 or a second drain electrode D2 of a second thin-film transistor TFT2 through a second contact hole H2. The second contact hole H2 may penetrate the common electrode 232, the first bank layer 262 and the planarization layer 140 to expose the second source electrode S2 or the second drain electrode D2. The sensing electrode 252 may be electrically connected to the second thin-film transistor TFT2 by filling the second contact hole H2. The sensing electrode 252 may be a cathode electrode of the photo sensing element PD receiving electrons generated from the photoelectric conversion layer 242 by receiving a signal applied from the second thin-film transistor TFT2.

The second contact hole H2 may be formed via a laser process or an etching process.

A passivation film 282 may be formed around the second opening filled with the sensing electrode 252. The passivation film 282 may electrically insulate the sensing electrode 252 from other conductive electrodes (e.g., the display pixel electrode 212 or the common electrode 232).

In the display device 1 according to this embodiment, the pixel PX including the emission area EA and the photo sensor PS including the photo sensing area PSA are not disposed on the same plane but are disposed vertically so that the virtual center point CP of the photo sensor PS is located in the emission area EA, and thus the spacing between the pixels PX and the spacing between the photo sensors PS can be reduced. For example, the spacings of the display device 1 can be substantially equal to spacings of a display device without a light sensing function. As a result, the display device 1 can display images at a high resolution with a light sensing function.

Since the effective sensing area RA of the photo sensing element PD and the emission area EA of the light-emitting element EL do not overlap each other, the efficiency of light emitted from the emissive layer 222 can be high, and the efficiency of the light incident on the photoelectric conversion layer 242 can be high.

Figure 17:
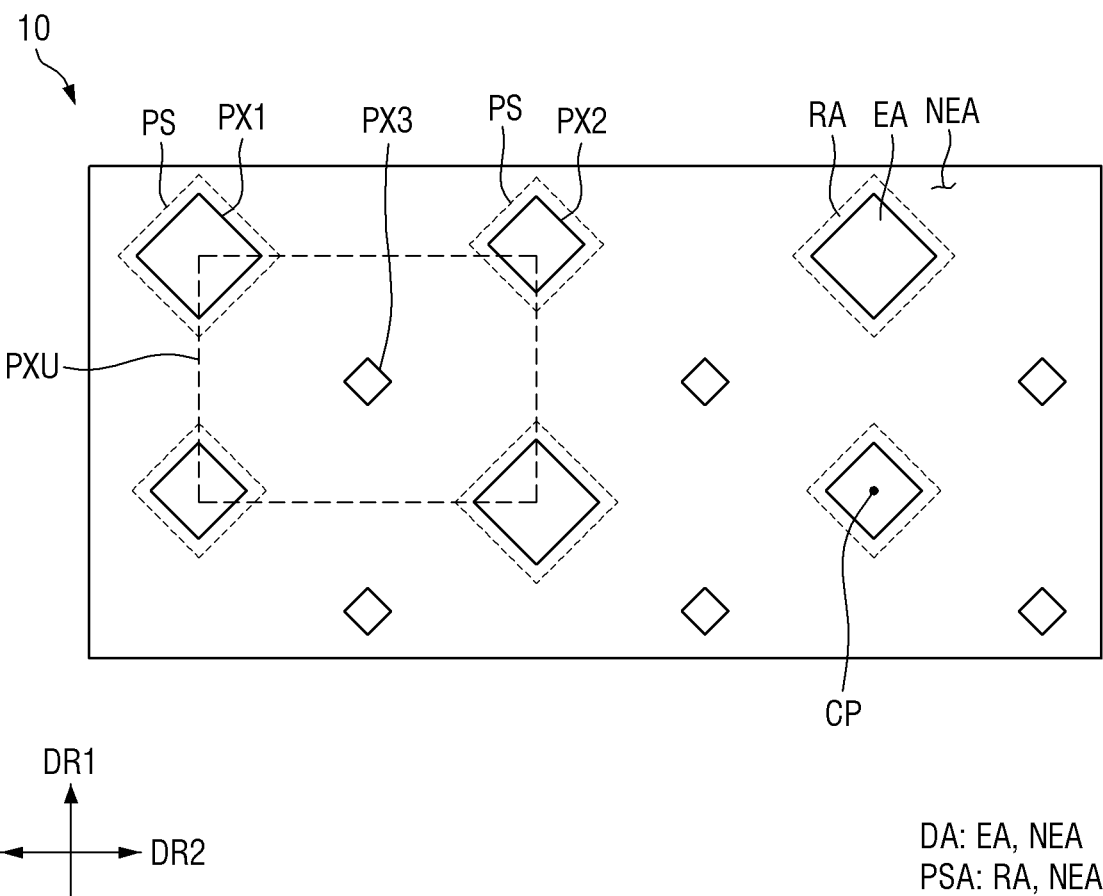
FIG. 17 is a plan view showing a layout of pixels and photo sensors of a display panel according to an embodiment of the present invention.
Figure 18:
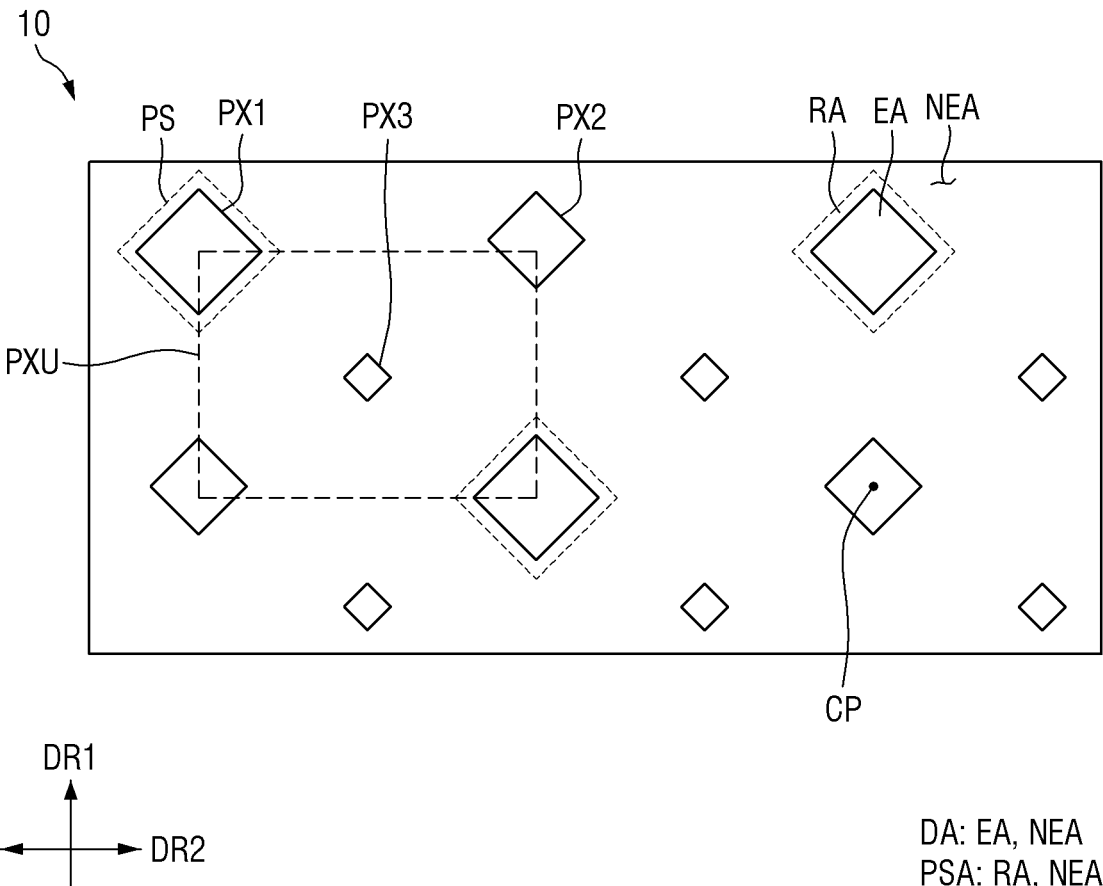
FIG. 18 is a plan view showing a layout of pixels and photo sensors of a display panel according to an embodiment of the present invention.

Hereinafter, a variety of embodiments of the pixels PX and the photo sensors PS of the display panel will be described with reference to FIGS. 17 and 18. FIG. 17 is a plan view showing a layout of pixels and photo sensors of a display panel according to an embodiment. FIG. 18 is a plan view showing a layout of pixels and photo sensors of a display panel according to an embodiment of the present invention.

Referring to FIG. 17, the display panel 10 may include a plurality of pixels PX disposed in the display area DA where images are displayed, and a plurality of photo sensors PS disposed in the photo sensing area PSA.

Unlike the plan view of FIG. 4, a first color pixel PX1 may overlap a photo sensor PS, and a second color pixel PX2 may overlap a photo sensor PS, but a third color pixel PX3 may overlap no photo sensor PS. In some embodiments, in a unit pixel PXU, the third color pixel PX3 including no photo sensor PS is located at the center point, and the first color pixels PX1 and the second color pixels PX2 including the photo sensors PS may be located at the vertexes, respectively.

Referring to FIG. 18, unlike the plan view of FIG. 4, the photo sensors PS may overlap only with the first color pixels PX1 but may not overlap the second color pixels PX2 and the third color pixel PX3.

In some embodiments, in a unit pixel PXU, the third color pixel PX3 including no photo sensor PS is located at the center point, and the first color pixels PX1 including the photo sensors PS and the second color pixels PX2 including no photo sensors PS may be located alternately at the vertexes.

Figure 19:
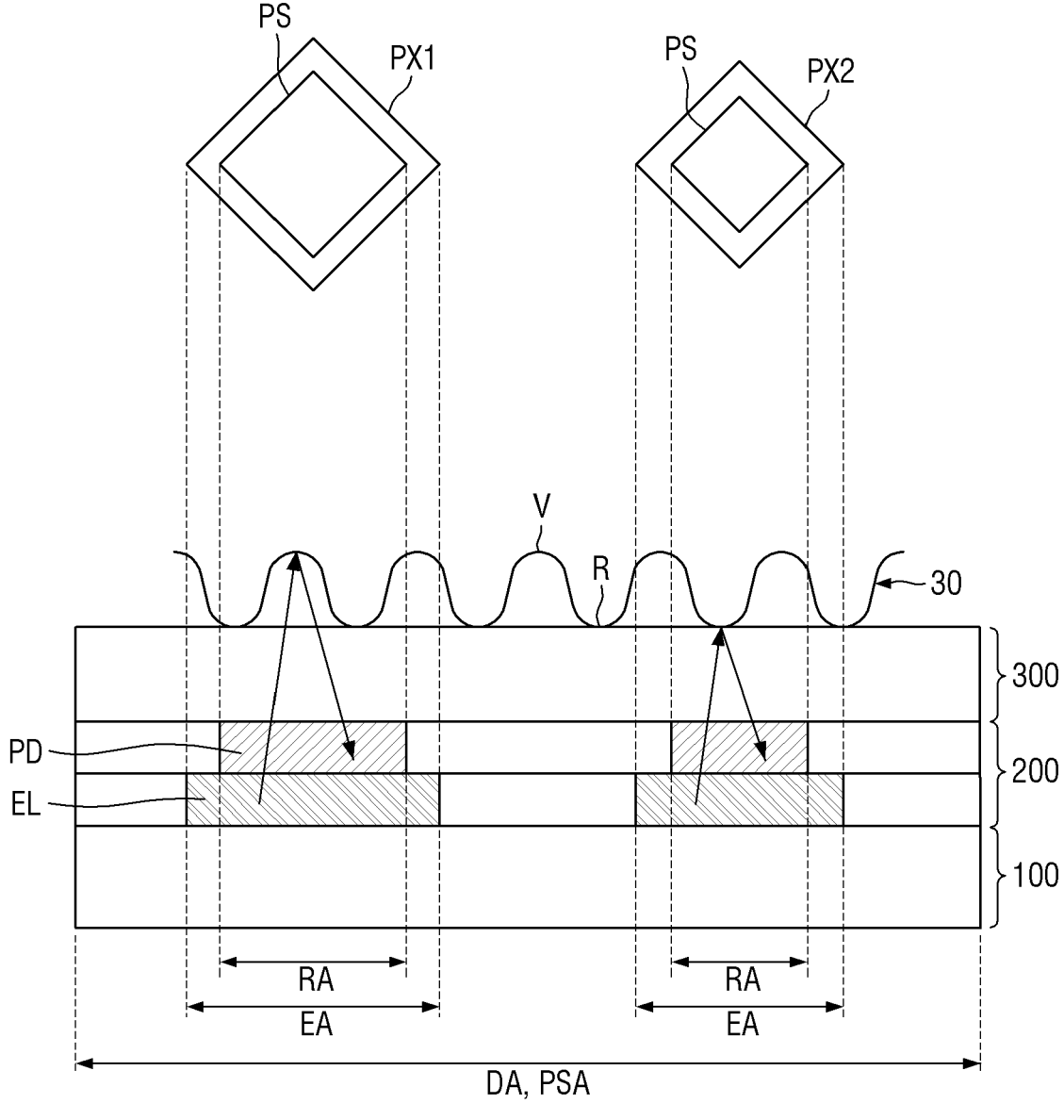
FIG. 19 is a view schematically showing a plan view showing the layout of pixels and photo sensors in a display device according to an embodiment of the present invention, and a cross-sectional view of the display device.

FIG. 19 is a view schematically showing a plan view showing the layout of pixels and photo sensors in a display device according to an embodiment, and a cross-sectional view of the display device.

The embodiment of FIG. 19 is different from the embodiment of FIG. 5 in that an emission area EA of each pixel PX is larger than an effective sensing area RA of a photo sensor PS included in a display device 1. When the emission area EA in which the light-emitting element EL is disposed is larger than the effective sensing area RA in which the photo sensing element PD is disposed, the amount of light emitted from the light-emitting element EL may increase. Since light may be emitted toward the outer portion of the emission area EA that does not overlap the effective sensing area RA, the amount of light reaching the fingerprint 30 can increase. This can increase the amount of incident light of the photo sensing element PD for deriving the ridges R and the valleys V of the fingerprint 30.

Figure 20:
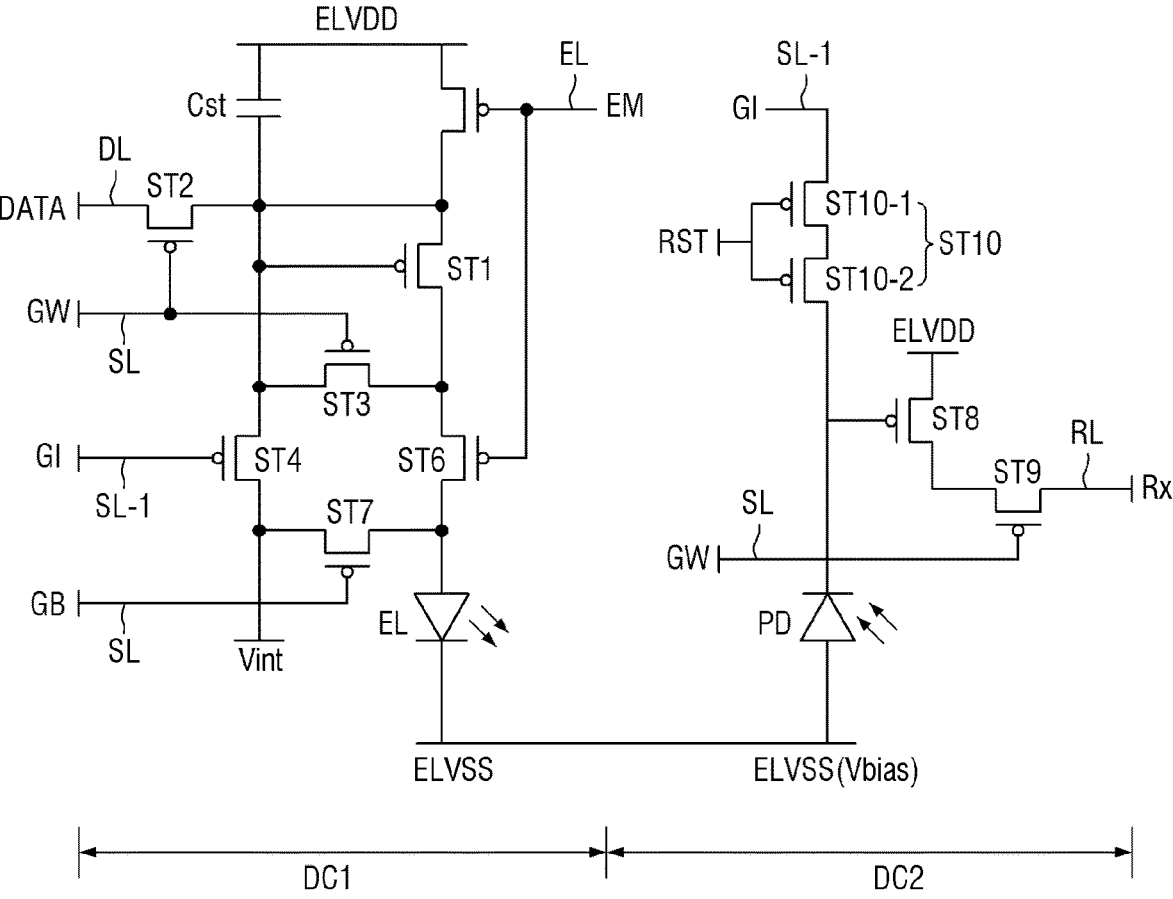
FIG. 20 is a circuit diagram of a pixel and a unit photo sensor of a display device according to an embodiment of the present invention.

FIG. 20 is a circuit diagram of a pixel and a unit photo sensor of a display device according to an embodiment of the present invention. The circuit diagram of FIG. 20 is different from FIG. 3 in that it further includes a plurality of transistors and a plurality of signals controlling the transistors.

Each pixel PX may include a driver circuit DC for supplying or receiving a driving current to the light-emitting element EL and/or the photo sensing element PD. The driver circuit DC may include a display circuit DC1 driving the pixel in each pixel PX, and a sensing circuit DC2 driving the photo sensor PS. The driving circuit DC may drive the pixel PX and the photo sensor PS together through a single integrated circuit.

The display circuit DC1 may have or may be formed of seven transistors and one capacitor, which is referred to as a 7T1C structure. For example, the 7T1C structure of the display circuit DC1 may include a compensation circuit for compensating threshold voltage deviations ΔVth of the first transistor ST1. The sensing circuit DC2 may have or may be formed of three transistors, which is referred to as a 3T structure. For example, the 3T structure of the sensing circuit DC2 may include a switching transistor and a reset transistor.

The display circuit DC1 may include a light-emitting element EL, first to seventh transistors ST1 to ST7 and a capacitor Cst. A data signal DATA, a first scan signal GW, a second scan signal GI, an emission control signal EM, a first supply voltage ELVDD, a second supply voltage ELVSS, and an initialization voltage VINT are applied to the display circuit DC1. The data signal DATA may be applied through a data line DL. The first scan signal GW and the second scan signal GI may be applied through a first scan line SL and a second scan line SL−1. The emission control signal EM may be applied through an emission signal control line EML. Each of the transistors may include a gate electrode, a source electrode and a drain electrode. In the following description, an example where the source electrode is the first electrode and the drain electrode is the second electrode for convenience of illustration.

Although the transistors are PMOS transistors in the drawings, some or all of the transistors may be implemented as NMOS transistors.

The first transistor ST1 is a driving transistor and may generate a driving current. The gate electrode may be connected to the first electrode (the lower one in the drawing) of the capacitor Cst, the first electrode may be connected to the first supply voltage ELVDD terminal via the fifth transistor ST5, and the second electrode may be connected to the anode electrode of the light-emitting element EL via the sixth transistor ST6. The first transistor T1 may receive the data signal DATA from the data line DL according to the switching operation of the second transistor ST2 and may supply a driving current to the light-emitting element EL.

The second transistor ST2 is a switching transistor, and has a gate electrode connected to the first scan signal GW terminal, a first electrode connected to a data signal DATA terminal, and a second electrode connected to the first electrode of the first transistor ST1. The second transistor ST2 may be turned on in response to the first scan signal GW to perform a switching operation of transferring the data signal DATA to the first electrode of the first transistor ST1.

The third transistor T3 is a compensation transistor and has a gate electrode connected to the first scan signal GW terminal, a first electrode connected to the second electrode of the first transistor ST1 and connected to the anode electrode of the light-emitting element EL via the sixth transistor ST6, and a second electrode connected to the first electrode of the capacitor Cst (the lower one in the drawings), a first electrode of the fourth transistor T4 and the gate electrode of the first transistor T1. The third transistor ST3 may be turned on in response to the first scan signal GW to diode-connect the first transistor ST1 by connecting the gate electrode of the first transistor ST1 to the second electrode of the first transistor ST1.

The fourth transistor T4 is a first initializing transistor that has a gate electrode connected to a second scan signal GI terminal, a second electrode connected to an initialization voltage VINT terminal, and a first electrode connected to the first electrode of the capacitor Cst (the lower one in the drawings), the second electrode of the third transistor ST3 and the gate electrode of the first transistor ST1. The fourth transistor ST4 may be turned on in response to the second scan signal GI to transfer the initialization voltage VINT to the gate electrode of the first transistor ST1, to initialize the voltage at the gate electrode of the first transistor ST1.

The fifth transistor ST5 is a first emission transistor that has a gate electrode connected to an emission control signal EM terminal, a first electrode connected to the first supply voltage ELVDD terminal, and a second electrode connected to the first electrode of the first transistor ST1 and the second electrode of the second transistor ST2.

The sixth transistor ST6 is a second emission transistor that has a gate electrode connected to the emission control signal EM terminal, a first electrode connected to the second electrode of the first transistor ST1 and the first electrode of the third transistor T3, and a second electrode connected to the anode electrode of the light-emitting element EL.

The fifth transistor ST5 and the sixth transistor ST6 are simultaneously turned on in response to the emission control signal EM so that the driving current flows through the light-emitting diode EL.

The seventh transistor ST7 is a second initializing transistor that has a gate electrode connected to the second scan signal GI terminal, a first electrode connected to the anode electrode of the light-emitting element EL, and a second electrode connected to the initialization voltage VINT terminal. The seventh transistor ST7 may be turned on in response to the emission control signal EM to initialize the anode electrode of the light-emitting element EL.

The second electrode (the upper one in the drawings) of the capacitor Cst is connected to the first supply voltage ELVDD terminal. The first electrode (the lower one in the drawings) of the capacitor Cst is connected to the gate electrode of the first transistor ST1, the second electrode of the third transistor ST3 and the first electrode of the fourth transistor ST4.

The sensing circuit DC2 may include a photo sensing element PD and eighth to tenth transistors ST8 to ST10. The sensing circuit DC2 applies the first scan signal GW, the second scan signal GI, the first supply voltage ELVDD and an initialization signal RST, and transmits a sensing signal Rx. The first scan signal GW and the second scan signal GI are provided through the first scan line SL and the second scan line SL−1, respectively, and the sensing signal Rx is transmitted through the sensing line RL.

The eighth transistor ST8 is a driving transistor, and has a gate electrode connected to the cathode electrode of the photo sensing element PD and a second electrode of the tenth transistor ST10, a first electrode connected to the first supply voltage ELVDD terminal, and a second electrode connected to a first electrode of the ninth transistor ST9. The eighth transistor ST8 may be turned on upon receiving an electrical signal generated by light incident on the photo sensing element PD, and may transmit a current proportional to the photocharge to the first electrode of the ninth transistor ST9.

The ninth transistor ST9 is a switch transistor, and has a gate electrode connected to the first scan signal GW terminal, and a second electrode connected to the sensing signal Rx terminal. The ninth transistor ST9 may be turned on in response to the first scan signal GW to transmit the sensing signal Rx corresponding to the current flowing through the eighth transistor ST8 to the sensing terminal.

The tenth transistor ST10 is a reset transistor, and may be turned on in response to the second scan signal GI to reset the potential of the eighth transistor ST8.

The sensing circuit DC2 may transmit the sensing signal Rx corresponding to the amount of light incident on the photo sensing element PD through the sensing line RL in accordance with the pulse period of the first scan signal GW.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed is:

1. A display device, comprising:
a substrate comprising a display area and a photo sensing area overlapping the display area;
a plurality of pixels disposed at the display area and having an emission area; and
a plurality of photo sensors disposed at the photo sensing area and having an effective sensing area, wherein
each of the plurality of pixels comprises a light-emitting element comprising a display pixel electrode, an emissive layer, and a common electrode,
wherein each of the plurality of photo sensors comprises a photo sensing element comprising a sensing electrode, a photoelectric conversion layer and the common electrode,
wherein the common electrode is disposed between the emissive layer and the photoelectric conversion layer, wherein a center point of the effective sensing area is located in the emission area in a plan view, wherein the emission area overlaps the effective sensing area, wherein the effective sensing area is larger than the emission area in the plan view, and wherein an edge of the effective sensing area surrounds an edge of the emission area in the plan view.

2. The display device of claim 1, wherein the emissive layer is disposed between the photoelectric conversion layer and the substrate.

3. The display device of claim 2, further comprising:

a transistor layer disposed between the substrate and the photoelectric conversion layer, wherein the sensing electrode is connected to the transistor layer through a contact hole penetrating the common electrode.

4. The display device of claim 1, wherein the photoelectric conversion layer is disposed between the emissive layer and the substrate.

5. A display device, comprising:

a substrate comprising a display area and a photo sensing area overlapping the display area;

a plurality of pixels disposed at the display area and having an emission area;

a plurality of photo sensors disposed at the photo sensing area and having an effective sensing area, wherein each of the plurality of pixels comprises a light-emitting element comprising a display pixel electrode, an emissive layer, and a common electrode, wherein each of the plurality of photo sensors comprises a photo sensing element comprising a sensing electrode, a photoelectric conversion layer and the common electrode, wherein the common electrode is disposed between the emissive layer and the photoelectric conversion layer, wherein a center point of the effective sensing area is located in the emission area in a plan view, wherein the emission area overlaps the effective sensing area, and wherein the photoelectric conversion layer is disposed between the emissive layer and the substrate; and a transistor layer disposed between the substrate and the emissive layer, wherein the display pixel electrode is connected to the transistor layer through a contact hole penetrating the common electrode.

6. A display device, comprising:

a substrate comprising a display area and a photo sensing area overlapping the display area;

a plurality of pixels disposed at the display area and having an emission area; and a plurality of photo sensors disposed at the photo sensing area and having an effective sensing area, wherein each of the plurality of pixels comprises a light-emitting element comprising a display pixel electrode, an emissive layer, and a common electrode, wherein each of the plurality of photo sensors comprises a photo sensing element comprising a sensing electrode, a photoelectric conversion layer and the common electrode, wherein the common electrode is disposed between the emissive layer and the photoelectric conversion layer, wherein a center point of the effective sensing area is located in the emission area in a plan view, and wherein the effective sensing area surrounds the emission area in the plan view.

7. The display device of claim 6, wherein a portion of the effective sensing area does not overlap the emission area.

8. The display device of claim 7, wherein the emissive layer is disposed between the photoelectric conversion layer and the substrate.

* * * * *